US010961411B2

(12) United States Patent
Tanikawa et al.

(10) Patent No.: US 10,961,411 B2
(45) Date of Patent: Mar. 30, 2021

(54) INKJET ADHESIVE, MANUFACTURING METHOD FOR SEMICONDUCTOR DEVICE, AND ELECTRONIC COMPONENT

(71) Applicant: SEKISUI CHEMICAL CO., LTD., Osaka (JP)

(72) Inventors: Mitsuru Tanikawa, Osaka (JP); Takashi Watanabe, Osaka (JP); Yusuke Fujita, Osaka (JP); Yoshito Fujita, Osaka (JP); Tasuku Yamada, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 16/206,463

(22) Filed: Nov. 30, 2018

(65) Prior Publication Data
US 2019/0092963 A1   Mar. 28, 2019

Related U.S. Application Data

(63) Continuation of application No. 15/518,680, filed as application No. PCT/JP2016/051575 on Jan. 20, 2016, now Pat. No. 10,202,519.

(30) Foreign Application Priority Data

Jan. 22, 2015  (JP) ................ 2015-010566
Jan. 22, 2015  (JP) ................ 2015-010567
Jul. 22, 2015  (JP) ................ 2015-144909
Jul. 22, 2015  (JP) ................ 2015-144910

(51) Int. Cl.
*H01L 23/48*  (2006.01)
*C09D 133/14*  (2006.01)
(Continued)

(52) U.S. Cl.
CPC ....... *C09D 133/14* (2013.01); *C08G 59/4215* (2013.01); *C08G 59/5033* (2013.01); *C08G 59/686* (2013.01); *C08L 33/08* (2013.01); *C09D 11/101* (2013.01); *C09D 11/107* (2013.01); *C09D 11/30* (2013.01); *C09D 11/52* (2013.01); *C09D 133/10* (2013.01); *C09J 4/06* (2013.01); *C09J 5/04* (2013.01); *C09J 5/06* (2013.01); *C09J 9/02* (2013.01); *C09J 133/10* (2013.01); *C09J 133/14* (2013.01); *C09J 163/00* (2013.01); *C09J 171/12* (2013.01); *C09J 201/02* (2013.01); *H01L 21/52* (2013.01); *H01L 24/27* (2013.01); *H01L 24/29* (2013.01); *H01L 24/48* (2013.01); *H01L 24/83* (2013.01); *H01L 24/91* (2013.01); *C09J 2203/326* (2013.01); *C09J 2301/414* (2020.08); *C09J 2301/416* (2020.08); *C09J 2433/00* (2013.01); *C09J 2461/00* (2013.01); *C09J 2463/00* (2013.01); *H01L 24/32* (2013.01); *H01L 24/73* (2013.01); *H01L 2224/04042* (2013.01); *H01L 2224/05599* (2013.01); *H01L 2224/2741* (2013.01); *H01L 2224/2783* (2013.01); *H01L 2224/27318* (2013.01); *H01L 2224/27515* (2013.01); *H01L 2224/27848* (2013.01); *H01L 2224/2919* (2013.01); *H01L 2224/29083* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/8322* (2013.01); *H01L 2224/83026* (2013.01); *H01L 2224/83359* (2013.01);
(Continued)

(58) Field of Classification Search
CPC ......... H01L 21/52; H01L 24/27; H01L 24/29; H01L 24/48; H01L 24/83; H01L 24/91; C08G 59/4215; C08G 59/5033; C08G 59/686; C08L 33/08; C09D 11/101; C09D 11/107; C09D 11/30; C09D 11/52; C09D 133/10; C09J 4/06; C09J 5/04; C09J 5/06; C09J 9/02; C09J 133/10; C09J 133/14; C09J 163/00; C09J 171/12; C09J 201/02
See application file for complete search history.

(56) References Cited

U.S. PATENT DOCUMENTS 6,214,460 B1    4/2001  Bluem et al.
2008/0090932 A1  4/2008  Madhusoodhanan et al.
(Continued)

FOREIGN PATENT DOCUMENTS

CN    102779798 A    11/2012
CN    103119109 A     5/2013
(Continued)

OTHER PUBLICATIONS

European Office Action for the Application No. 16 740 213.0 dated Mar. 4, 2019.
(Continued)

*Primary Examiner* — Victor A Mandala
*Assistant Examiner* — Colleen E Snow
(74) *Attorney, Agent, or Firm* — Cheng Law Group, PLLC

(57) ABSTRACT

Provided is an inkjet adhesive which is applied using an inkjet device, wherein the adhesive can suppress generation of voids in the adhesive layer and, after bonding, can enhance adhesiveness, moisture-resistant adhesion reliability, and cooling/heating cycle reliability. An inkjet adhesive according to the present invention comprises a photocurable compound, a photo-radical initiator, a thermosetting compound having one or more cyclic ether groups or cyclic thioether groups, and a compound capable of reacting with the thermosetting compound, and the compound capable of reacting with the thermosetting compound contains aromatic amine.

17 Claims, 5 Drawing Sheets

(51) Int. Cl.

| | | |
|---|---|---|
| *C09J 163/00* | (2006.01) | |
| *C09J 201/02* | (2006.01) | |
| *H01L 21/52* | (2006.01) | |
| *C08G 59/42* | (2006.01) | |
| *C08G 59/68* | (2006.01) | |
| *C08G 59/50* | (2006.01) | |
| *C08L 33/08* | (2006.01) | |
| *C09J 4/06* | (2006.01) | |
| *H01L 23/00* | (2006.01) | |
| *C09J 5/06* | (2006.01) | |
| *C09J 171/12* | (2006.01) | |
| *C09D 11/101* | (2014.01) | |
| *C09D 11/107* | (2014.01) | |
| *C09D 11/30* | (2014.01) | |
| *C09D 11/52* | (2014.01) | |
| *C09D 133/10* | (2006.01) | |
| *C09J 5/04* | (2006.01) | |
| *C09J 9/02* | (2006.01) | |
| *C09J 133/10* | (2006.01) | |
| *C09J 133/14* | (2006.01) | |

(52) U.S. Cl.
CPC ............ *H01L 2224/83856* (2013.01); *H01L 2224/83862* (2013.01); *H01L 2224/83947* (2013.01); *H01L 2225/0651* (2013.01); *H01L 2225/06565* (2013.01); *H01L 2924/00014* (2013.01)

(56) References Cited

U.S. PATENT DOCUMENTS

| | | |
|---|---|---|
| 2010/0009287 A1 | 1/2010 | Kodama |
| 2012/0248634 A1 | 10/2012 | Mitsukura et al. |
| 2012/0256326 A1 | 10/2012 | Mitsukura et al. |
| 2012/0263946 A1 | 10/2012 | Mitsukura et al. |
| 2012/0285674 A1 | 11/2012 | Hirano |
| 2013/0208064 A1 | 8/2013 | Ueda et al. |
| 2016/0009947 A1 | 1/2016 | Sugiyama et al. |
| 2016/0049297 A1 | 2/2016 | Tanikawa et al. |
| 2017/0158922 A1 | 6/2017 | Tanikawa et al. |

FOREIGN PATENT DOCUMENTS

| | | |
|---|---|---|
| CN | 106103633 A | 11/2016 |
| EP | 2 620 479 A1 | 7/2013 |
| EP | 3 214 142 A1 | 9/2017 |
| EP | 3 222 692 A1 | 9/2017 |
| JP | 3-192178 A | 8/1991 |
| JP | 9-67747 A | 3/1997 |
| JP | 2008-13705 A | 1/2008 |
| JP | 2010-37456 A | 2/2010 |
| JP | 2012-238819 A | 12/2012 |
| JP | 2013-82836 A | 5/2013 |
| JP | 2014-63954 A | 4/2014 |
| JP | 2014-220372 A | 11/2014 |
| JP | 2014-237814 A | 12/2014 |
| KR | 10-2010-0007737 A | 1/2010 |
| KR | 10-2013-0050361 A | 5/2013 |
| WO | WO-2011/058998 A1 | 5/2011 |
| WO | WO-2011/156060 A2 | 12/2011 |
| WO | WO-2014/157626 A1 | 10/2014 |
| WO | WO 2015/076235 A1 | 5/2015 |
| WO | WO-2017/044381 A1 | 3/2017 |

OTHER PUBLICATIONS

International Search Report for the Application No. PCT/JP2016/051575 dated Apr. 12, 2016.
Written Opinion of the International Searching Authority (PCT/ISA/237) for Application No. PCT/JP2016/051575 dated Apr. 12, 2016.
International Search Report for the Application No. PCT/JP2016/051576 dated Apr. 12, 2016.
Written Opinion of the International Searching Authority (PCT/ISA/237) for Application No. PCT/JP2016/051576 dated Apr. 12, 2016.
Non-Final Office Action for the U.S. Appl. No. 15/518,723 from the United States Patent and Trademark office dated Dec. 18, 2017.
Korean Office Action for the Application No. 10-2016-7034862 dated Oct. 25, 2017.
Database WPI Week 200837 Thomson Scientific London, GB; AN 2008-F66420 XP002780926 (and JP 2008-13705 A).
Supplementary European Search Report for the Application No. EP 16 740 212.2 dated May 23, 2018.
Supplementary European Search Report for the Application No. EP 16 740 213.0 dated May 24, 2018.
The First Office Action for the Application No. 201680003481.9 from The State Intellectual Property Office of the People's Republic of China dated Jun. 26, 2018.
The Second Office Action for the Application No. 201680003482.3 from The State Intellectual Property Office of the People's Republic of China dated Sep. 10, 2018.

[FIG. 1]
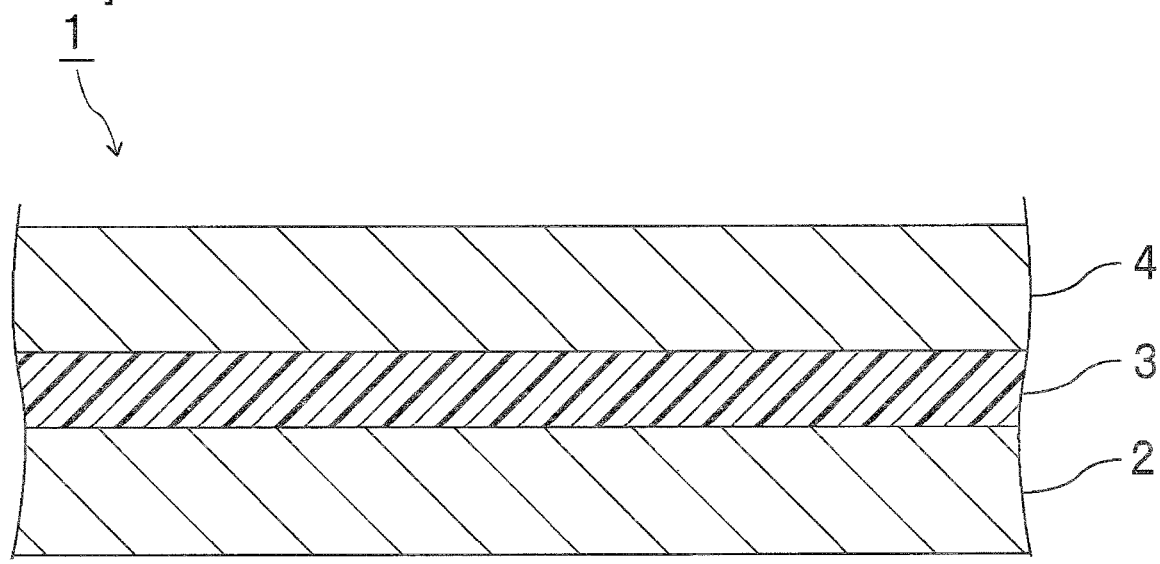

[FIG. 2]
(a)
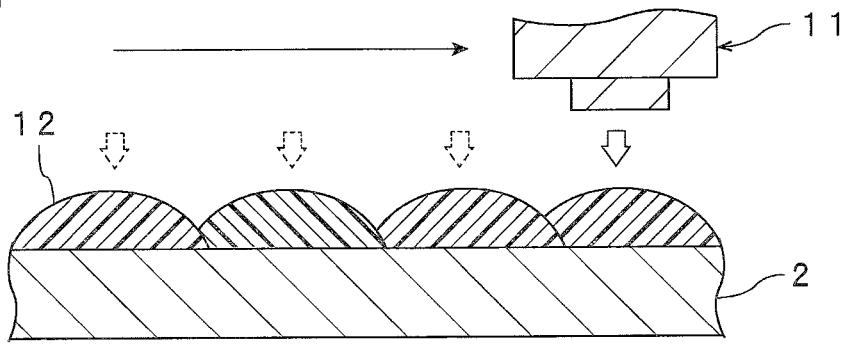
(b)
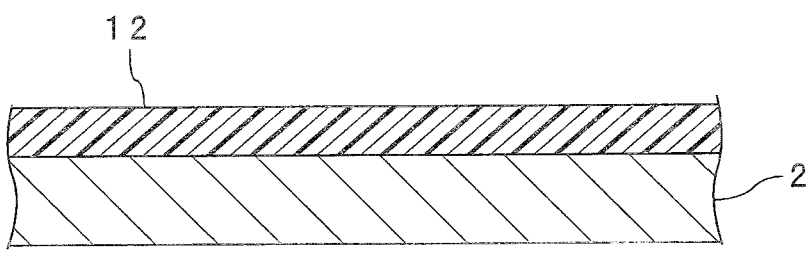
(c)
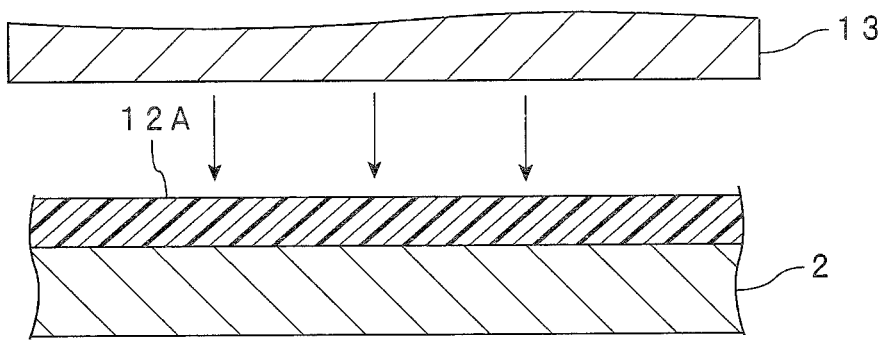
(d)
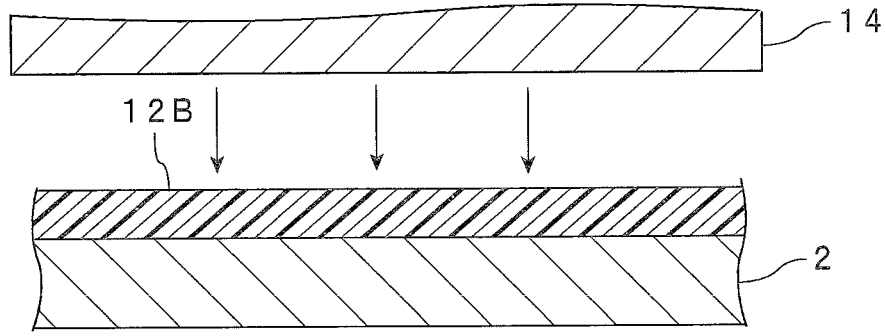
(e)
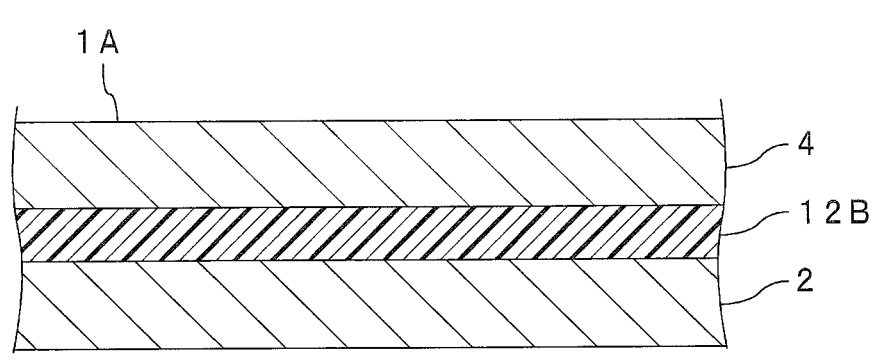

[FIG. 3]
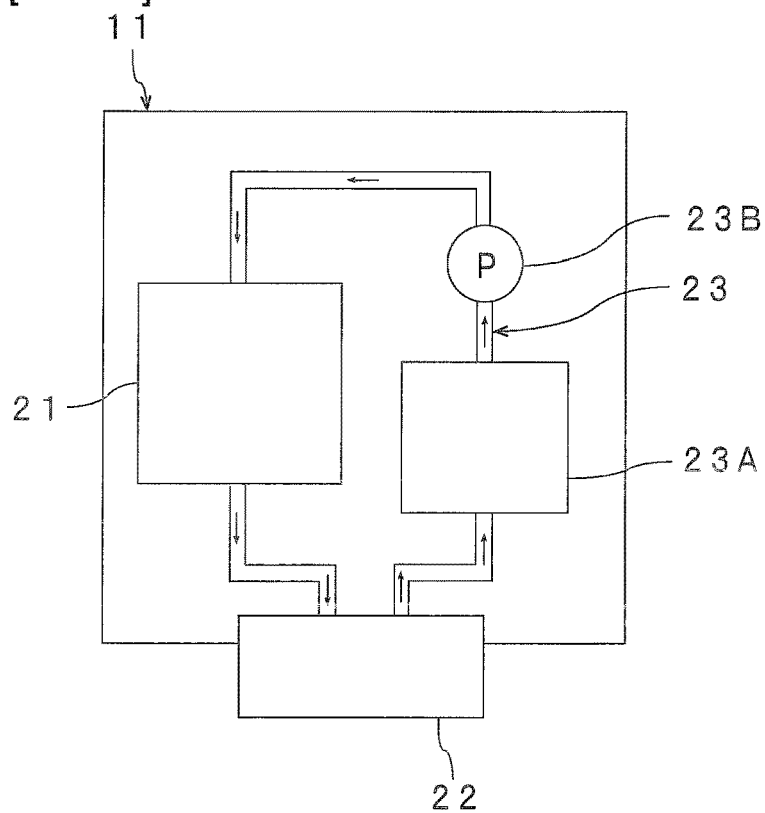
[FIG. 4]
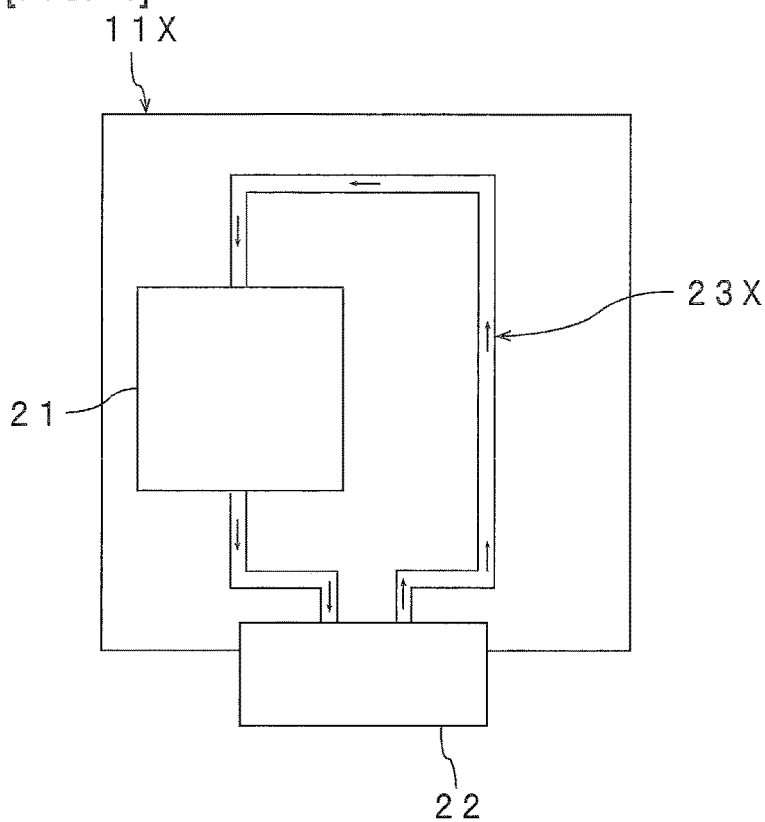

[FIG. 5]
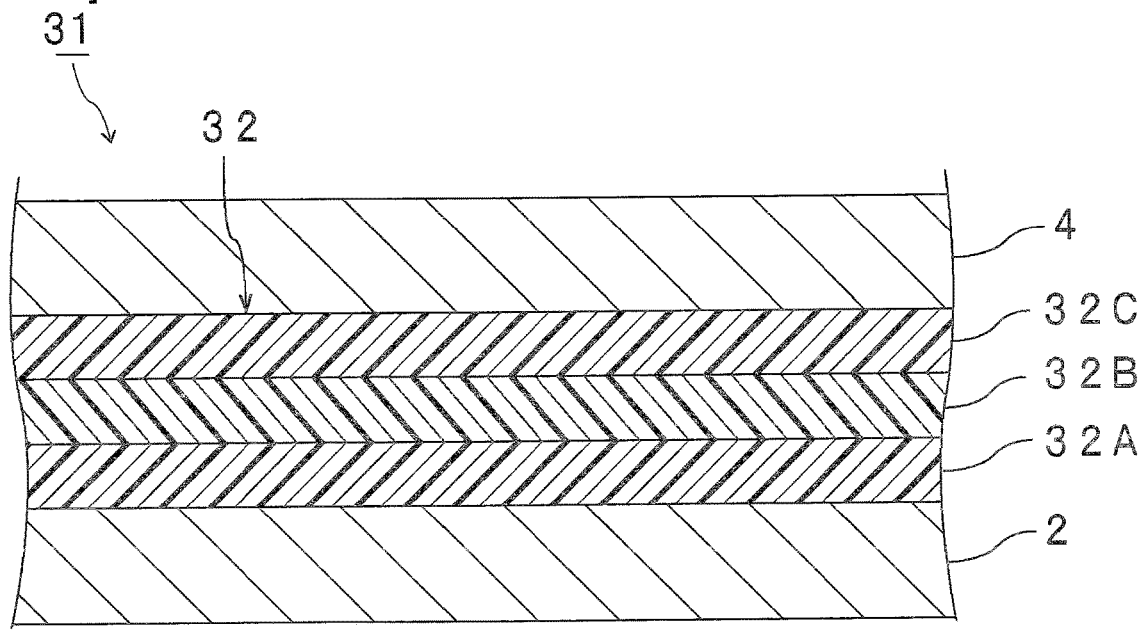
[FIG. 6]
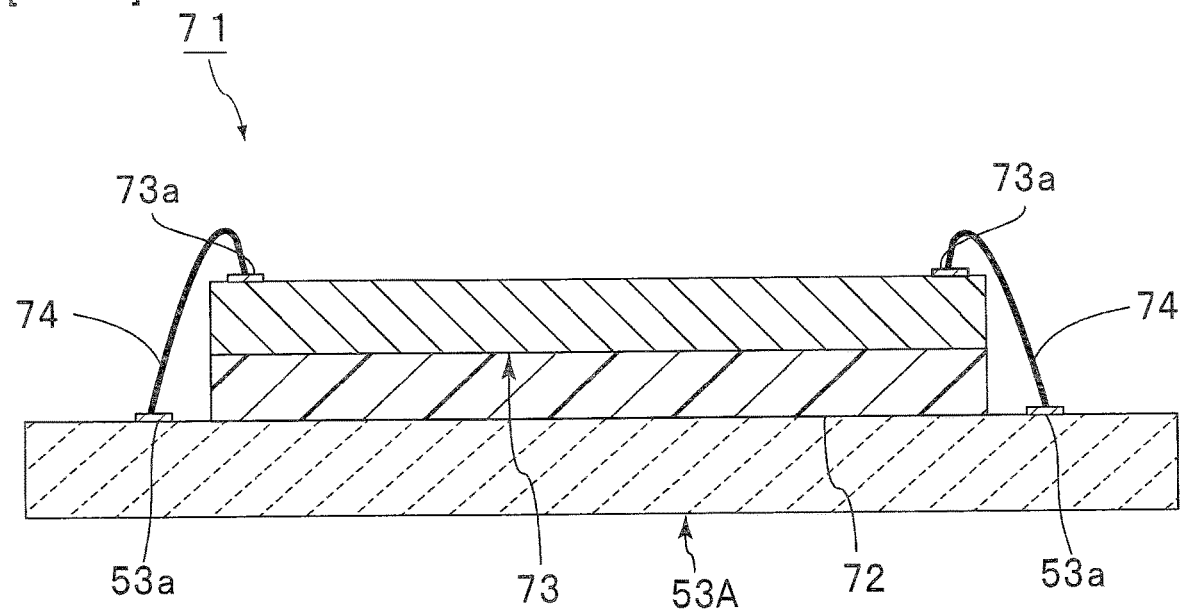

[FIG. 7]
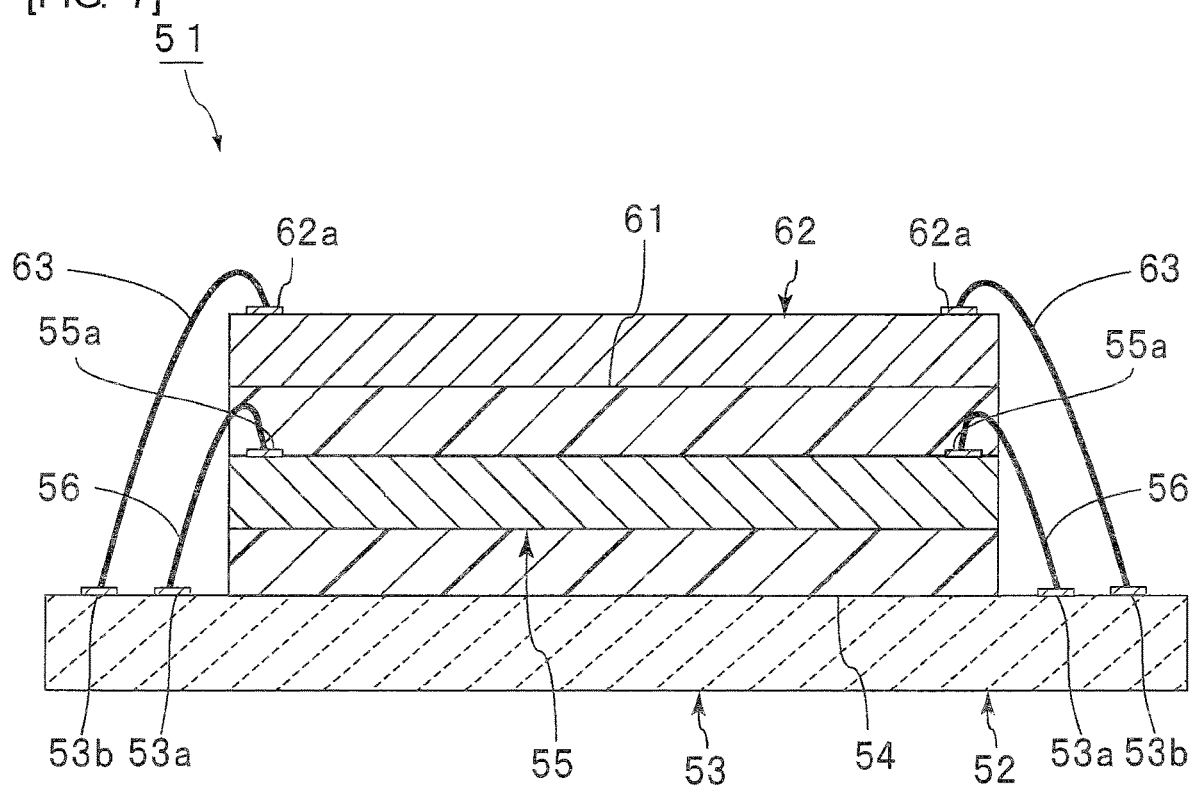

INKJET ADHESIVE, MANUFACTURING METHOD FOR SEMICONDUCTOR DEVICE, AND ELECTRONIC COMPONENT

CROSS-REFERENCE TO RELATED APPLICATIONS

This application is a Continuation Application of patent application Ser. No. 15/518,680, filed on Apr. 12, 2017, which is a 371 application of Application Serial No. PCT/JP2016/051575, filed on Jan. 20, 2016, which is based on Japanese Patent Application Nos. 2015-010566 and 2015-010567, filed Jan. 22, 2015, and 2015-144909 and 2015-144910, filed on Jul. 22, 2015, the entire contents of which are hereby incorporated by reference.

TECHNICAL FIELD

The present invention relates to an inkjet adhesive which is applied using an inkjet device to be used. Also, the present invention relates to a method for producing a semiconductor device using the adhesive, and an electronic component using the adhesive.

BACKGROUND ART

A paste-like adhesive is mainly used as an adhesive for fixing a semiconductor element for joining between a semiconductor element and a support member such as a substrate. In recent years, downsizing of the support member to be used is also required with downsizing of semiconductor elements, and downsizing and improvement in performance of the semiconductor packages. For such a requirement, the paste-like adhesive paste-like adhesive unfortunately spreads, causing protrusion. Further, in the paste-like adhesive, it is difficult to control a thickness, and consequently, the semiconductor element is inclined to cause problems such as a defect of wire bonding. Therefore, joining using a conventional paste-like adhesive cannot adequately respond to recent semiconductor packages.

Further, in recent years, as described in Patent Document 1 described below, an adhesive sheet having a film-like adhesive layer has been used.

In a joining method using the adhesive sheet, the adhesive sheet (adhesive layer) is bonded to a back surface of a semiconductor wafer first, and a dicing sheet is bonded to the other surface of the adhesive layer. Thereafter, the semiconductor wafer is singulated with the adhesive layer bonded to the semiconductor wafer by dicing to obtain a semiconductor element. Next, the semiconductor element with the adhesive layer is picked up and joined to the support member. Thereafter, undergoing assembling steps such as wire bonding, sealing and the like, a semiconductor device is obtained.

However, in the production of a semiconductor device using the adhesive sheet, since the adhesive sheet clings to a cutting blade at the time of dicing to deteriorate a cutting property, there is a problem that the semiconductor chip chips, resulting in a reduction of a yield. Further, since a support member such as a substrate has a height difference of a wiring pattern, voids easily remain in the height difference portion. The void causes the reliability to deteriorate.

Further, Patent Document 2 discloses an adhesive containing a radiation-polymerizable compound, a photo initiator, and a thermosetting resin. However, in such an adhesive, there is a problem that with a substrate having a height difference of a wiring pattern, voids are generated to deteriorate reliability.

Patent Document 3 described below discloses an adhesive including (1) an epoxy resin, (2) a radically curable resin, (3) a photo-radical initiator, and (4) a latent epoxy curing agent. (4) The latent epoxy curing agent can be obtained by reacting (a) an amine compound represented by a specific formula (I), (b) a polyamine compound having two or more amino groups in a molecule, (c) an organic polyisocyanate compound, and (d) an epoxy compound. However, even if using such an adhesive, there is a problem that in a substrate having a height difference of a wiring pattern, voids are generated to deteriorate reliability.

Further, in conventional adhesives, adhesiveness after bonding may become low. Moreover, the conventional adhesives also have a problem of low reliability since the adhesiveness of the adhesive may become low when the adhesive is exposed to extreme conditions such as a high temperature or a high humidity.

RELATED ART DOCUMENT

Patent Document

Patent Document 1: JP 3-192178 A
Patent Document 2: WO 2011/058998 A1
Patent Document 3: JP 2013-82836 A

SUMMARY OF THE INVENTION

Problems to be Solved by the Invention

It is an object of the present invention to provide an inkjet adhesive which is applied using an inkjet device, wherein the adhesive can suppress generation of voids in the adhesive layer and, after bonding, can enhance adhesiveness, moisture-resistant adhesion reliability, and cooling/heating cycle reliability. Further, it is also an object of the present invention to provide a method for manufacturing a semiconductor device using the above-mentioned adhesive, and an electronic component using the above-mentioned adhesive.

Means for Solving the Problems

According to a broad aspect of the present invention, there is provided an inkjet adhesive comprising a photocurable compound, a photo-radical initiator, a thermosetting compound having one or more cyclic ether groups or cyclic thioether groups, and a compound capable of reacting with the thermosetting compound, the compound capable of reacting with the thermosetting compound containing aromatic amine.

The aromatic amine is solid at 25° C. in a specific aspect of the adhesive according to the present invention, a melting point of the aromatic amine is 50° C. or higher in another specific aspect, and the aromatic amine has two or more amino groups in still another specific aspect.

The thermosetting compound having one or more cyclic ether groups or cyclic thioether groups is solid at 25° C. in a specific aspect of the adhesive according to the present invention, and a softening point of the thermosetting compound having one or more cyclic ether groups or cyclic thioether groups is 30° C. or higher in another specific aspect.

In a specific aspect of the adhesive according to the present invention, the thermosetting compound having one or more cyclic ether groups or cyclic thioether groups contains a thermosetting compound having one or more epoxy groups or thiirane groups.

In a specific aspect of the adhesive according to the present invention, the adhesive includes a photocurable and thermosetting compound having one or more (meth)acryloyl groups and one or more cyclic ether groups or cyclic thioether groups.

In a specific aspect of the adhesive according to the present invention, the photocurable and thermosetting compound having one or more (meth)acryloyl groups and one or more cyclic ether groups or cyclic thioether groups contains a photocurable and thermosetting compound having one or more (meth)acryloyl groups and one or more epoxy groups or thiirane groups.

In a specific aspect of the adhesive according to the present invention, the photocurable and thermosetting compound contains 4-hydroxybutyl (meth)acrylate glycidyl ether.

In a specific aspect of the adhesive according to the present invention, the photocurable compound includes a first photocurable compound having one (meth)acryloyl group, and a second photocurable compound having two or more (meth)acryloyl groups.

In a specific aspect of the adhesive according to the present invention, in 100 wt % of the total of the first photocurable compound and the second photocurable compound, the content of the first photocurable compound is at least 70 wt % and at most 99.9 wt %, and the content of the second photocurable compound is at least 0.1 wt % and at most 30 wt %.

In a specific aspect of the adhesive according to the present invention, the first photocurable compound (A1) contains 2-ethylhexyl (meth)acrylate.

In a specific aspect of the adhesive according to the present invention, the viscosity at 25° C. and at 10 rpm measured according to JIS K 2283 is at least 5 mPa·s and at most 1600 mPa·s.

According to a broad aspect of the present invention, provided is a method for producing a semiconductor device comprising an application step of applying the above-mentioned inkjet adhesive onto the surface of a support member for mounting a semiconductor element or the surface of a semiconductor element using an inkjet device to form an adhesive layer; a step of allowing curing of the adhesive layer to proceed by light irradiation to form a B-staged adhesive layer; a step of laminating a semiconductor element on the surface opposite to a side of the support member or the semiconductor element of the B-staged adhesive layer; and a step of thermally curing the B-staged adhesive layer after the lamination of the semiconductor element.

According to a broad aspect of the present invention, provided is a method for producing a semiconductor device comprising an application step of ejecting the above-mentioned inkjet adhesive to the surface of a semiconductor wafer using an inkjet device to form an adhesive layer; a step of allowing curing of the adhesive layer to proceed by light irradiation to form a B-staged adhesive layer; a step of laminating a cover glass on the surface opposite to a side of the semiconductor wafer of the B-staged adhesive layer to prepare a laminate; a step of thermally curing the B-staged adhesive layer in the laminate; and a step of cutting the laminate after thermal curing.

According to a broad aspect of the present invention, provided is an electronic component comprising a first electronic component main body, a second electronic component main body, and an adhesive layer making connection between the first electronic component main body and the second electronic component main body, and the adhesive layer is a cured product of the above-mentioned inkjet adhesive.

In a specific aspect of the electronic component according to the present invention, the first electronic component main body is a support member for mounting a semiconductor element or a semiconductor element, and the second electronic component main body is a semiconductor element.

Effect of the Invention

Since the inkjet adhesive according to the present invention includes a photocurable compound, a photo-radical initiator, a thermosetting compound having one or more cyclic ether groups or cyclic thioether groups, and a compound capable of reacting with the thermosetting compound, wherein the compound capable of reacting with the thermosetting compound contains aromatic amine, the inkjet adhesive can suppress generation of voids in the adhesive layer when applying the inkjet adhesive according to the present invention using an inkjet device and curing the adhesive. Moreover, after bonding, adhesiveness, moisture-resistant adhesion reliability and cooling/heating cycle reliability can be enhanced.

BRIEF DESCRIPTION OF DRAWINGS

FIG. 1 is a front sectional view schematically showing an electronic component prepared using the inkjet adhesive of an embodiment of the present invention.

FIG. 2(a) to 2(e) is a sectional view for explaining steps of a method for producing the electronic component shown in FIG. 1.

FIG. 3 is a schematic configuration diagram showing an example of an inkjet device used in a method for producing an electronic component shown in FIG. 2.

FIG. 4 is a schematic configuration diagram showing another example of an inkjet device used in the method for producing the electronic component shown in FIG. 2.

FIG. 5 is a front sectional view schematically showing a variation of the electronic component shown in FIG. 1.

FIG. 6 is a front sectional view schematically showing a first variation of an electronic component prepared using the inkjet adhesive of an embodiment of the present invention.

FIG. 7 is a front sectional view schematically showing a second variation of an electronic component prepared using the inkjet adhesive of an embodiment of the present invention.

MODE(S) FOR CARRYING OUT THE INVENTION

Hereinafter, the present invention will be described in detail.

An inkjet adhesive (hereinafter, sometimes abbreviated to an adhesive) according to the present invention is applied using an inkjet device to be used. The adhesive according to the present invention differs from an adhesive applied by screen printing or an adhesive applied by a dispenser.

The adhesive according to the present invention is cured by light irradiation and heating to be used. The adhesive according to the present invention is preferably cured by heating after light irradiation allows curing of the adhesive to proceed and used. The adhesive according to the present invention is a photocurable and thermosetting adhesive and has photocurability and heat-curability. The adhesive according to the present invention is different from an adhesive in which only photo-curing is performed and an adhesive in which only thermal curing is performed.

The adhesive according to the present invention includes a photocurable compound (curable compound capable of being cured by light irradiation) and a thermosetting compound (curable compound capable of being cured by heating). The adhesive according to the present invention includes a thermosetting compound having one or more cyclic ether groups or cyclic thioether groups as the thermosetting compound. Further, the adhesive according to the present invention includes a photo-radical initiator and a compound capable of reacting with the thermosetting compound. In the adhesive according to the present invention, the compound capable of reacting with the thermosetting compound contains aromatic amine.

In the adhesive of the present invention, since the above-mentioned constitution is provided, it is possible to cause an adhesive layer to hardly generate voids when applying the inkjet adhesive according to the present invention using an inkjet device and curing the adhesive. Particularly, it is possible to effectively suppress generation of voids in the adhesive layer when the inkjet adhesive according to the present invention is applied using an inkjet device and cured by heating after light irradiation allows curing of the adhesive to proceed. Moreover, in the adhesive according to the present invention, after bonding, adhesiveness, moisture-resistant adhesion reliability and cooling/heating cycle reliability can be enhanced. In the adhesive according to the present invention, adhesiveness is hardly degraded even when a bonded article is exposed to extreme conditions such as a high temperature or a high humidity after performing adhesion using the adhesive according to the present invention. Further, in the adhesive according to the present invention, the thickness accuracy of the adhesive layer can be increased.

In the present invention, particularly, the above-mentioned effects are adequately achieved since aromatic amine is used in conjunction with the photocurable compound, the photo-radical initiator and the thermosetting compound having one or more cyclic ether groups or cyclic thioether groups.

When an inkjet adhesive according to the present invention is irradiated with light of a cumulative light quantity of 1000 mJ/cm$^2$ so that illumination at a wavelength of 365 nm is 100 mW/cm$^2$ to obtain a B-staged adhesive, the elastic modulus at 25° C. of the B-staged adhesive is preferably $5.0 \times 10^2$ Pa or more, more preferably $8.0 \times 10^2$ Pa or more, and preferably $8.0 \times 10^4$ Pa or less, and more preferably $5.0 \times 10^4$ Pa or less. When the elastic modulus is the above-mentioned lower limit or more, displacement of the semiconductor chip or the like hardly occurs. When the elastic modulus is the above-mentioned upper limit or less, an adhesive force after bonding the semiconductor chip or the like becomes higher, and generation of voids is suppressed. In addition, the illumination was measured with "UIT-201" manufactured by USHIO INC.

The elastic modulus is measured at 25° C. in the conditions of a measurement plate: parallel plates with a diameter of 8 mm and a frequency of 1 Hz using a viscoelasticity measurement apparatus ARES manufactured by TA Instruments Japan Inc. In addition, in the present specification, the elastic modulus means storage elastic modulus (G').

Since the adhesive according to the present invention is applied using the inkjet device, it is generally liquid at 25° C. The viscosity at 25° C. of the adhesive is preferably 3 mPa·s or more, more preferably 5 mPa·s or more, furthermore preferably 10 mPa·s or more, moreover preferably 160 mPa·s or more, and preferably 2000 mPa·s or less, more preferably 1600 mPa·s or less and moreover preferably 1500 mPa·s or less. From the viewpoint of further increasing the thickness accuracy of the adhesive layer and further suppressing generation of voids in the adhesive layer, the viscosity at 25° C. of the adhesive is particularly preferably at least 160 mPa·s and at most 1600 mPa·s.

The viscosity is measured at 25° C. and at 10 rpm according to JIS K 2283 using an E-type viscometer ("TVE-22L" manufactured by Toki Sangyo Co., Ltd.).

The adhesive is suitably used for bonding an electronic component. The adhesive is preferably not a resist composition, and preferably not a composition for forming a resist film.

A method for producing a semiconductor device according to the present invention comprises an application step of applying the above-mentioned inkjet adhesive onto the surface of a support member for mounting a semiconductor element or the surface of a semiconductor element using an inkjet device to form an adhesive layer; a step of allowing curing of the adhesive layer to proceed by light irradiation to form a B-staged adhesive layer; a step of laminating a semiconductor element on the surface opposite to a side of the support member or the semiconductor element of the B-staged adhesive layer; and a step of thermally curing the B-staged adhesive layer after the lamination of the semiconductor element.

Further, a method for producing a semiconductor device according to the present invention comprises an application step of ejecting the above-mentioned inkjet adhesive to the surface of a semiconductor wafer using an inkjet device to form an adhesive layer; a step of allowing curing of the adhesive layer to proceed by light irradiation to form a B-staged adhesive layer; a step of laminating a cover glass on the surface opposite to a side of the semiconductor wafer of the B-staged adhesive layer to prepare a laminate; a step of thermally curing the B-staged adhesive layer in the laminate; and a step of cutting the laminate after thermal curing.

When the adhesive according to the present invention is used, it is possible to increase the thickness accuracy of the adhesive layer and further suppress generation of voids in the adhesive layer. Accordingly, the adhesive according to the present invention is able to be suitably used for the method for producing a semiconductor device of the present invention.

The adhesive is preferably ejected in a state of being warmed to 40° C. or higher and 100° C. or lower when ejecting the adhesive by the inkjet device. From the viewpoint of forming the adhesive layer with higher accuracy and further suppressing generation of voids in the adhesive layer, it is preferred to apply the inkjet adhesive while circulating the inkjet adhesive.

The above-mentioned inkjet device preferably has an ink tank in which the adhesive is stored, an ejection portion connected to the ink tank from which the adhesive is ejected, and a circulation channel portion connected to the ejection portion at its one end and connected to the ink tank at the other end, the inside of which the adhesive flows through.

When the adhesive is applied, in the inkjet device, the adhesive is applied while being circulated by transferring the adhesive from the ink tank to the ejection portion, and then transferring the adhesive not ejected from the ejection portion to the ink tank through the circulation channel portion. When the adhesive is applied while being circulated, the effect of the present invention is more effectively achieved. That is, it is possible to further increase the thickness accuracy of the adhesive layer and further suppress generation of voids in the adhesive layer.

In the present invention, an adhesive layer having a large thickness can be formed with high accuracy. Further, in the present invention, even a multilayered adhesive layer can be finely formed with high accuracy.

Hereinafter, the present invention will become apparent from description of specific embodiments and examples of the present invention in reference to drawings.

FIG. 1 is a front sectional view schematically showing an electronic component prepared using the inkjet adhesive of an embodiment of the present invention.

The electronic component 1 shown in FIG. 1 includes a first electronic component main body 2, an adhesive layer 3 arranged on the surface of the first electronic component main body 2, and a second electronic component main body 4 arranged on the surface of the adhesive layer 3. The second electronic component main body 4 is arranged on a side opposite to a side of the first electronic component main body 2 of the adhesive layer 3. The first electronic component main body 2 is arranged on a first surface of the adhesive layer 3. The second electronic component main body 4 is arranged on a second surface opposite to the first surface of the adhesive layer 3. The adhesive layer 3 is an adhesive layer after photo-curing and thermal curing and a cured adhesive layer. In order to form the adhesive layer 3, the inkjet adhesive of an embodiment of the present invention is used. The inkjet adhesive is applied using an inkjet device, curing of the adhesive proceeds by light irradiation, and then the adhesive is cured by heating to form an adhesive layer 3.

Specific examples of the electronic component main body include a circuit board, a semiconductor wafer, a semiconductor wafer after dicing (divided semiconductor wafer, semiconductor element), a cover glass, a capacitor, a diode, a printed circuit board, a flexible printed circuit board, a glass epoxy substrate and a glass board. The electronic component main body may be a support member for mounting a semiconductor element.

Since an adhesive layer formed with high accuracy is particularly required, the electronic component main body is preferably a circuit board, a cover glass, a semiconductor wafer, or a semiconductor wafer after dicing.

Since an adhesive layer formed with high accuracy is particularly required, the first electronic component main body is preferably a support member for mounting a semiconductor element or a semiconductor element, more preferably a circuit board or a semiconductor element, and moreover preferably a circuit board or a semiconductor wafer after dicing. Since an adhesive layer formed with high accuracy is particularly required, the second electronic component main body is preferably a semiconductor element, and more preferably a semiconductor wafer after dicing.

Since an adhesive layer formed with high accuracy is particularly required, it is preferred that the first electronic component main body is a circuit board or a semiconductor wafer after dicing, and the second electronic component main body is a semiconductor wafer after dicing, and more preferred that the first electronic component main body is a circuit board, and the second electronic component main body is a semiconductor wafer after dicing. The above-mentioned electronic component is preferably an electronic component for a semiconductor device.

The electronic component preferably includes a semiconductor element and is preferably a semiconductor device.

Hereinafter, an example of a method for producing the electronic component shown in FIG. 1 will be described in reference to FIG. 2(a) to 2(e).

First, as shown in FIG. 2 (a), an inkjet adhesive is applied onto the first electronic component main body 2 using an inkjet device 11 to form an adhesive layer 12 (application step). Herein, the adhesive is applied throughout the surface of the first electronic component main body 2. After the application of the adhesive, droplets of the adhesive are mixed with one another to form an adhesive layer 12 in a state shown in FIG. 2(b).

As shown in FIG. 3, the inkjet device 11 has an ink tank 21, an ejection portion 22, and a circulation channel portion 23 therein.

The circulation channel portion 23 has a buffer tank 23A and a pump 23B within the circulation channel portion 23. However, as with the inkjet device 11X as shown in FIG. 4, the circulation channel portion 23X does not have to have a buffer tank and a pump within the circulation channel portion 23X. The circulation channel portion preferably has the above-mentioned buffer tank within the circulation channel portion and preferably has the above-mentioned pump within the circulation channel portion. Further, the circulation channel portion may have a flow velocimeter, a thermometer, a filter, a liquid level sensor and the like in addition to the buffer tank and the pump within the circulation channel portion.

The adhesive is stored in the ink tank 21. The adhesive is ejected from the ejection portion 22 (inkjet head). The ejection portion 22 includes an ejection nozzle. The ejection portion 22 is connected to the ink tank 21. The ink tank 21 and the ejection portion 22 are connected to each other with the channel interposed therebetween. One end of the circulation channel portion 23 is connected to the ejection portion 22 and the other end is connected to the ink tank 21. The adhesive flows through the inside of the circulation channel portion 23.

When a buffer tank 23A or a pump 23B is provided, the buffer tank 23A and the pump 23B are each preferably placed between the ejection portion 22 and the ink tank 21. The buffer tank 23A is placed at a position closer to the ejection portion 22 than the pump 23B. The pump 23B is placed at a position closer to the ink tank 21 than the buffer tank 23A. The adhesive is temporarily stored in the buffer tank 23A.

Examples of the ejection portion include inkjet heads of a thermal type, a bubble jetting type, an electromagnetic valve type, and a piezo type. Examples of a circulation channel portion in the ejection portion include an end shooter type which is branched from a common circulation channel (manifold) to an ejection nozzle, and a side shooter type in which an ink is circulated through the ejection nozzle. From the viewpoint of enhancing an ejecting property of the adhesive to further increase the formation accuracy of a fine adhesive layer, it is preferred that the inkjet device is an inkjet device using an inkjet head of a piezo type, and the adhesive is applied by the action of a piezo element in the application step.

With respect to a method of circulating the adhesive, it is possible to employ a method of using an ink's own weight, or a method of using pressuring/depressuring of a pump or the like to circulate the adhesive. These methods may be used in combination of two or more thereof. Examples of the pump to be used include a non-pulsatile pump of a cylinder type, a propeller pump, a gear pump and a diaphragm pump.

From the viewpoint of increasing circulation efficiency to further increase the formation accuracy of a fine adhesive layer, the circulation channel portion preferably includes a pump for transferring the adhesive in the circulation channel portion.

In an ejection nozzle of the ejection portion, it is preferred that the adhesive is maintained at an appropriate pressure and pressure fluctuation (pulsation) is low in the range of the appropriate pressure. When a pump or the like is used, a damper is preferably provided between the pump and the ejection portion in order to suppress the pulsation of the pump. Such a damper includes a buffer tank in which the adhesive is temporarily stored and a membrane type damper.

From the viewpoint of forming the cured adhesive layer with higher accuracy, the circulation channel portion preferably includes, within the circulation channel portion, a buffer tank in which the adhesive is temporarily stored.

When the adhesive is circulated while being heated, a temperature of the adhesive can be adjusted by introducing a heater in the ink tank or by using a heater at the circulation channel portion.

When the adhesive is circulated while being heated, a temperature of the adhesive can be adjusted by introducing a heater in the ink tank 21 or by using a heater at the circulation channel portion 23 or 23X.

In the application step, in the inkjet device 11, the adhesive is transferred from the ink tank 21 to the ejection portion 22, and then the adhesive not ejected from the ejection portion 22 is transferred to the ink tank 21 through the circulation channel portion 23. Thereby, the adhesive is preferably applied while being circulated in the application step.

Next, as shown in FIGS. 2(b) and 2(c), after the application step, the adhesive layer 12 is irradiated with light from a first light irradiation part 13 to allow curing of the adhesive layer 12 to proceed (first light irradiation step). Thereby, an adhesive layer 12A having being irradiated with light from a first light irradiation part 13 is formed. The adhesive layer 12A is a preliminary cured product and the B-staged adhesive layer. The elastic modulus at 25° C. of this B-staged adhesive layer is preferably set to at least $5.0 \times 10^2$ Pa and at most $8.0 \times 10^4$ Pa. When irradiated with light from a second light irradiation part 14 described later, a wavelength or irradiation intensity of irradiation light from the first light irradiation part 13 may be the same as or different from the wavelength or irradiation intensity of irradiation light from the second light irradiation part 14 described later. From the viewpoint of the further enhancement of curability of the adhesive layer, the irradiation intensity of irradiation light from the second light irradiation part 14 is preferably higher than that of irradiation light from the first light irradiation part 13. When the photocurable compound and the photocurable and thermosetting compound are used, it is preferred to implement the above-mentioned first light irradiation step and a second light irradiation step described later in order to control photocurability.

In addition, "the adhesive layer 12 is irradiated with light from a first light irradiation part 13 to allow curing of the adhesive layer 12 to proceed" includes allowing a reaction to proceed to make the adhesive thicker.

A device which emits light is not particularly limited, and examples thereof include a light-emitting diode generating ultraviolet light (UV-LED), a metal halide lamp, a high-pressure mercury lamp, and an ultra-high pressure mercury lamp. From the viewpoint of further increasing the formation accuracy of an adhesive layer, particularly, the UV-LED is preferably used for the first light irradiation part.

Next, as shown in FIGS. 2(c) and 2(d), after the first light irradiation step, the adhesive layer 12A having been irradiated with light from the first light irradiation part 13 may be irradiated with light from a second light irradiation part 14 which is separated from the first light irradiation part 13 to allow curing of the adhesive layer 12A to further proceed (second light irradiation step). Thereby, an adhesive layer 12B having irradiated with light from the second light irradiation part 14 is formed. The adhesive layer 12B is a preliminary cured product and the B-staged adhesive layer. The elastic modulus at 25° C. of the surface of this B-staged adhesive layer is preferably set to at least $5.0 \times 10^2$ Pa and at most $8.0 \times 10^4$ Pa. In addition, it is preferred to set the elastic modulus at 25° C. of the surface of the B-staged adhesive layer after the first light irradiation step among the B-staged adhesive layer after the second light irradiation step and the B-staged adhesive layer after the first light irradiation step to at least $5.0 \times 10^2$ Pa and at most $8.0 \times 10^4$ Pa. It is more preferred to set the elastic moduli at 25° C. of the surfaces of both of the B-staged adhesive layer after the second light irradiation step and the B-staged adhesive layer after the first light irradiation step to at least $5.0 \times 10^2$ Pa and at most $8.0 \times 10^4$ Pa.

The second light irradiation step is preferably implemented prior to a lamination step described later, and preferably implemented prior to a heating step. From the viewpoint of forming the cured adhesive layer with higher accuracy, it is preferred to implement the second light irradiation step. However, the second light irradiation step does not always have to be implemented, and after the first light irradiation step, the lamination step described later may be implemented without implementing the second light irradiation step.

Next, as shown in FIGS. 2(d) and 2(e), after the second light irradiation step, a second electronic component main body 4 is arranged on the adhesive layer 12B having irradiated with light, and the first electronic component main body 2 is bonded to the second electronic component main body 4 with the adhesive layer 12B having irradiated with light interposed therebetween by application of pressure to obtain a primary laminate 1A (lamination step). In addition, when the second light irradiation step is not implemented after the first light irradiation step, a second electronic component main body 4 is arranged on the adhesive layer 12A having been irradiated with light, and the first electronic component main body 2 is bonded to the second electronic component main body 4 with the adhesive layer 12A having been irradiated with light interposed therebetween by application of pressure to obtain a primary laminate (lamination step).

Next, after the lamination step, the primary laminate 1A is heated, and thereby the adhesive layer 12B between the first electronic component main body 2 and the second electronic component main body 4 is cured to obtain an electronic component (heating step). As a result of this, a cured product of the inkjet adhesive is obtained. In this way, the electronic component 1 shown in FIG. 1 can be obtained.

In addition, by repeating the application step and the first light irradiation step, the adhesive layer may be brought into a multilayer to form a multilayered adhesive layer. As shown in FIG. 5, an electronic component 31 provided with an adhesive layer 32 having a plurality of laminated adhesive layers 32A, 32B and 32C may be formed.

In the above-mentioned production method of an electronic component, from the viewpoint of forming the cured adhesive layer with higher accuracy by enhancing an ejecting property and a transferring property of the adhesive, a temperature of the adhesive being circulated is preferably 30° C. or higher, more preferably 40° C. or higher, and preferably 120° C. or lower and more preferably 100° C. or lower.

From the viewpoint of forming the cured adhesive layer with higher accuracy, a pressure applied in bonding the electronic component main bodies to each other in the lamination step is preferably 0.01 MPa or more, more preferably 0.05 MPa or more, and preferably 10 MPa or less and more preferably 8 MPa or less.

From the viewpoint of forming the cured adhesive layer with higher accuracy, a temperature at the time of bonding the electronic component main bodies to each other in the lamination step is preferably 30° C. or higher, more preferably 40° C. or higher, and preferably 150° C. or lower and more preferably 130° C. or lower.

The adhesive has photocurability and heat-curability. The adhesive contains the photocurable compound, the thermosetting compound, the photo-radical initiator, and the compound capable of reacting with the thermosetting compound. The compound capable of reacting with the thermosetting compound contains aromatic amine. The adhesive preferably includes a photocurable and thermosetting compound (curable compound capable of being cured by both of light irradiation and heating). The adhesive preferably includes a curing accelerator.

Hereinafter, the components capable of being used for the adhesive will be described in detail.

(Photocurable Compound)

Examples of the photocurable compound include a curable compound having a (meth)acryloyl group, a curable compound having a vinyl group and a curable compound having a maleimide group. From the viewpoint of forming the cured adhesive layer with higher accuracy, the photocurable compound preferably has (one or more) (meth)acryloyl groups. As the photocurable compound, only one type may be used, or a combination of at least two types may also be used.

In the present specification, the curable compound having a (meth)acryloyl group refers to a compound having at least one of a methacryloyl group and an acryloyl group.

As the photocurable compound, a photocurable compound having a (meth)acryloyl group (referred to as a first photocurable compound (A1)) may be used, or a photocurable compound having two or more (meth)acryloyl groups (referred to as a second photocurable compound (A2)) may be used. The first photocurable compound (A1) is, for example, a monofunctional compound. The second photocurable compound (A2) is, for example, a polyfunctional compound. The polymerization of the second photocurable compound (A2) proceeds by light irradiation since the second photocurable compound (A2) has at least two (meth) acryloyl groups, resulting in curing of the second photocurable compound (A2). As each of the first photocurable compound (A1) and the second photocurable compound (A2), only one type may be used, or a combination of at least two types may also be used.

From the viewpoint of the further enhancement of adhesiveness, moisture-resistant adhesion reliability and cooling/heating cycle reliability by further suppressing of voids, the photocurable compound preferably contains the first photocurable compound (A1) and the second photocurable compound (A2). Further, when the first photocurable compound (A1) is used in conjunction with the second photocurable compound (A2) as the photocurable compound, a cured adhesive layer can be formed with high accuracy.

Examples of the second photocurable compound (A2) include a (meth)acrylic acid adduct of a polyhydric alcohol, a (meth)acrylic acid adduct of a modified product of a polyhydric alcohol with an alkylene oxide, urethane (meth) acrylate compounds and polyester (meth)acrylate compounds. Examples of the polyhydric alcohol include diethylene glycol, triethylene glycol, polyethylene glycol, dipropylene glycol, tripropylene glycol, polypropylene glycol, trimethylolpropane, cyclohexanedimethanol, tricyclodecanedimethanol, an alkylene oxide adduct of bisphenol A, and pentaerythritol.

The second photocurable compound (A2) may be difunctional (meth)acrylate, may be trifunctional (meth)acrylate or may be tetra- or more functional (meth)acrylate.

Examples of the difunctional (meth)acrylate include 1,4-butanediol di(meth)acrylate, 1,6-hexanediol di(meth)acrylate, 1,9-nonanediol di(meth)acrylate, 1,10-decanediol di(meth)acrylate, neopentyl glycol di(meth)acrylate, 2,4-dimethyl-1,5-pentanediol di(meth)acrylate, butylethylpropanediol di(meth)acrylate, ethoxylated cyclohexane methanol di(meth)acrylate, polyethylene glycol di(meth)acrylate, oligo(ethylene glycol) di(meth)acrylate, ethylene glycol di(meth)acrylate, 2-ethyl-2-butyl-butanediol di(meth)acrylate, 2-ethyl-2-butyl-propanediol di(meth)acrylate, tricyclodecane di(meth)acrylate, and dipropylene glycol di(meth) acrylate.

Examples of the trifunctional (meth)acrylate include trimethylolpropane tri(meth)acrylate, trimethylolethane tri (meth)acrylate, alkylene oxide-modified trimethylolpropane tri(meth)acrylate, pentaerythritol tri(meth)acrylate, dipentaerythritol tri(meth)acrylate, trimethylolpropane tri((meth) acryloyloxy propyl)ether, isocyanuric acid alkylene oxide-modified tri(meth)acrylate, propionic acid dipentaerythritol tri(meth)acrylate, tri((meth)acryloyloxyethyl)isocyanurate, and sorbitol tri(meth)acrylate.

Examples of the tetrafunctional (meth)acrylate include pentaerythritol tetra(meth)acrylate, sorbitol tetra(meth)acrylate, ditrimethylolpropane tetra(meth)acrylate, and propionic acid dipentaerythritol tetra(meth)acrylate.

Examples of the pentafunctional (meth)acrylate include sorbitol penta(meth)acrylate, and dipentaerythritol penta(meth)acrylate.

Examples of the hexafunctional (meth)acrylate include dipentaerythritol hexa(meth)acrylate, sorbitol hexa(meth) acrylate, and phosphazene alkylene oxide-modified hexa (meth)acrylate.

The term "(meth)acrylate" refers to an acrylate and a methacrylate. The term "(meth)acrylic" refers to an acrylic and a methacrylic.

The second photocurable compound (A2) is preferably a second photocurable compound having a polycyclic skeleton or a urethane skeleton and having at least two (meth) acryloyl groups. When the second photocurable compound is used, moisture resistance and heat resistance of a cured product of the adhesive can be enhanced. Accordingly, reliability of an electronic component can be enhanced. The second photocurable compound (A2) may have the polycyclic skeleton or may have the urethane skeleton.

Specific examples of the second photocurable compound (A2) having the polycyclic skeleton and having two or more (meth)acryloyl groups include tricyclodecane dimethanol di(meth)acrylate, isobornyldimethanol di(meth)acrylate and dicyclopentenyldimethanol di(meth)acrylate. From the viewpoint of the further enhancement of moisture resistance, moisture resistance and heat resistance of the cured product, the second photocurable compound (A2) is preferably tricyclodecane dimethanol di(meth)acrylate.

The polycyclic skeleton is a structure having contiguous multiple cyclic skeletons in which each ring is condensed. The polycyclic skeleton is not a structure in which two or more rings are not condensed and are contained separately like a bisphenol skeleton, a biphenyl skeleton or a triphenylmethane skeleton.

Examples of the polycyclic skeleton include a polycyclic alicyclic skeleton and a polycyclic aromatic skeleton.

Examples of the polycyclic alicyclic skeleton include a bicycloalkane skeleton, a tricycloalkane skeleton, a tetracycloalkane skeleton and an isobornyl skeleton.

Examples of the polycyclic aromatic skeleton include a naphthalene ring skeleton, an anthracene ring skeleton, a phenanthrene ring skeleton, a tetracene ring skeleton, a chrysene ring skeleton, a triphenylene ring skeleton, a tetraphene ring skeleton, a pyrene ring skeleton, a pentacene ring skeleton, a picene ring skeleton and a perylene ring skeleton.

The polyfunctional compound having the urethane skeleton and having two or more (meth)acryloyl groups is not particularly limited, and it can be obtained, for example, by the following method. A polyol is reacted with difunctional or more isocyanate, and an alcohol or a (meth)acrylic monomer having an acid group is further reacted with a residual isocyanate group. A (meth)acrylic monomer having a hydroxyl group may be reacted with the difunctional or more isocyanate.

Specifically, for example, 1 mole of trimethylolpropane and 3 mole of isophorone diisocyanate are reacted under the catalytic influence of a Sn-based catalyst. The urethane-modified (meth)acrylic compound can be obtained by reacting the isocyanate group remaining in the resulting compound with hydroxyethyl acrylate which is an acrylic monomer having 2 mole of a hydroxyl group.

The above-mentioned polyol is not particularly limited, and examples thereof include ethylene glycol, glycerin, sorbitol, trimethylolpropane, and (poly)propylene glycol.

The above-mentioned isocyanate is not particularly limited as long as it is difunctional or more. Examples of the isocyanates include isophorone diisocyanate, tyrylene-2,4-diisocyanate, trylene-2,6-diisocyanate, hexamethylene diisocyanate, trimethylhexamethylene diisocyanate, 4,4'-diphenylmethane diisocyanate (MDI), hydrogenated MDI, polymeric MDI, 1,5-naphthalene diisocyanate, norbornane diisocyanate, tolidine diisocyanate, xylylene diisocyanate (XDI), hydrogenated XDI, lysine diisocyanate, triphenylmethane triisocyanate, tris(isocyanatophenyl)thiophosphate, tetramethylxylene diisocyanate, and 1,6,10-undecane triisocyanate.

Specific examples of the above-mentioned first photocurable compound (A1) include methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, t-butyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, allyl (meth)acrylate, benzyl (meth)acrylate, cyclohexyl (meth)acrylate, phenyl (meth)acrylate, 2-methoxyethyl (meth)acrylate, 2-phenoxyethyl (meth)acrylate, methoxydiethylene glycol (meth)acrylate, methoxytriethylene glycol (meth)acrylate, methoxypropylene glycol (meth)acrylate, methoxydipropylene glycol (meth)acrylate, isobornyl (meth)acrylate, dicyclopentadienyl (meth)acrylate, 2-hydroxy-3-phenoxypropyl (meth)acrylate, glycerol mono (meth)acrylate, 2-ethylhexyl (meth)acrylate, dihydroxycyclopentadienyl (meth)acrylate, dicyclopentenyl (meth) acrylate, dicyclopentenyloxyethyl (meth)acrylate, dicyclopentanyl (meth)acrylate, naphthyl (meth)acrylate, rauryl (meth)acrylate, and stearyl (meth)acrylate.

From the viewpoint of the further enhancement of adhesiveness, moisture-resistant adhesion reliability and cooling/heating cycle reliability by further suppressing of voids, the first photocurable compound (A1) preferably contains 2-ethylhexyl (meth)acrylate.

Examples of the above-mentioned photocurable compound having a vinyl group include vinyl ethers, ethylene derivatives, styrene, chloromethylstyrene, α-methylstyrene, maleic acid anhydride, dicyclopentadiene, N-vinylpyrrolidone, and N-vinylformamide.

The above-mentioned photocurable compound having a maleimide group is not particularly limited, and examples thereof include N-methylmaleimide, N-ethylmaleimide, N-hexylmaleimide, N-propylmaleimide, N-butylmaleimide, N-octylmaleimide, N-dodecylmaleimide, N-cyclohexylmaleimide, N-phenylmaleimide, N-p-carboxyphenylmaleimide, N-p-hydroxyphenylmaleimide, N-p-chlorophenylmaleimide, N-p-tolylmaleimide, N-p-xylylmaleimide, N-o-chlorophenylmaleimide, N-o-tolylmaleimide, N-benzylmaleimide, N-2,5-diethylphenylmaleimide, N-2,5-dimethylphenylmaleimide, N-m-tolylmaleimide, N-α-naphthylmaleimide, N-o-xylylmaleimide, N-m-xylylmaleimide, bismaleimide methane, 1,2-bismaleimide ethane, 1,6-bismaleimide hexane, bismaleimide dodecane, N,N'-m-phenylenedimaleimide, N,N'-p-phenylenedimaleimide, 4,4'-bismaleimidediphenyl ether, 4,4'-bismaleimidediphenyl methane, 4,4'-bismaleimide-di(3-methylphenyl)methane, 4,4'-bismaleimide-di(3-ethylphenyl)methane, 4,4'-bismaleimide-di(3-methyl-5-ethyl-phenyl)methane, N,N'-(2,2-bis-(4-phenoxyphenyl)propane)dimaleimide, N,N'-trylene-2,4-dimaleimide, N,N'-trylene-2,6-dimaleimide, and N,N'-m-xylylenedimaleimide.

From the viewpoint of forming the cured adhesive layer with higher accuracy, in 100 wt % of the adhesive, the content of the photocurable compound is preferably 5 wt % or more, more preferably 10 wt % or more, and preferably 80 wt % or less and more preferably 70 wt % or less, and the total content of the first photocurable compound (A1) and the second photocurable compound (A2) is preferably 5 wt % or more, more preferably 10 wt % or more, and preferably 80 wt % or less and more preferably 70 wt % or less. From the viewpoint of further increasing the thickness accuracy of the adhesive layer and further suppressing generation of voids in the adhesive layer, in 100 wt % of the adhesive, the content of the photocurable compound is particularly preferably at least 5 wt % and at most 80 wt %, and the total content of the first photocurable compound (A1) and the second photocurable compound (A2) is particularly preferably at least 5 wt % and at most 80 wt %.

From the viewpoint of further reducing an outgas at the time of being exposed to elevated temperatures by further suppressing of voids and enhancing moisture-resistant reliability, in 100 wt % of the total of the first photocurable compound (A1) and the second photocurable compound (A2), preferably, the content of the first photocurable compound (A1) is at least 50 wt % and at most 99.9 wt % and the content of the second photocurable compound (A2) is at least 0.1 wt % and at most 50 wt %, more preferably, the content of the first photocurable compound (A1) is at least 55 wt % and at most 99 wt % and the content of the second photocurable compound (A2) is at least 1 wt % and at most 45 wt %, and moreover preferably, the content of the first photocurable compound (A1) is at least 60 wt % and at most 98 wt % and the content of the second photocurable compound (A2) is at least 2 wt % and at most 40 wt %. In 100 wt % of the total of the first photocurable compound (A1) and the second photocurable compound (A2), preferably, the content of the first photocurable compound (A1) may be at least 50 wt % and at most 99.95 wt % and the content of the second photocurable compound (A2) may be at least 0.05 wt % and at most 50 wt %, or the content of the first photocurable compound (A1) may be at least 70 wt % and at most 99.9 wt % and the content of the second photocurable compound (A2) may be at least 0.1 wt % and at most 30 wt %, or the content of the first photocurable compound (A1) may be at least 80 wt % and at most 99.5 wt % and the content of the second photocurable compound (A2) v at least 0.5 wt % and at most 20 wt %.

From the viewpoint of the further enhancement of adhesiveness, moisture-resistant adhesion reliability and cooling/heating cycle reliability by further suppressing of voids, in 100 wt % of the adhesive, the content of the first photocurable compound (A1) is preferably 0.05 wt % or more, more preferably 0.1 wt % or more, and preferably 70 wt % or less and more preferably 50 wt % or less, and the content of 2-ethylhexyl (meth)acrylate is preferably 0.05 wt % or more, more preferably 0.1 wt % or more, and preferably 70 wt % or less and more preferably 50 wt % or less.

(Photocurable and Thermosetting Compound)

From the viewpoint of further increasing the thickness accuracy of the adhesive layer and further suppressing generation of voids in the adhesive layer, the adhesive preferably includes the photocurable and thermosetting compound. Examples of the photocurable and thermosetting compound include compounds having various photocurable functional groups (photocurable reactive group) and various thermosetting functional groups. From the viewpoint of forming the cured adhesive layer with higher accuracy, the photocurable reactive group of the photocurable and thermosetting compound is preferably a (meth)acryloyl group. From the viewpoint of forming the cured adhesive layer with higher accuracy, the photocurable and thermosetting compound preferably has one or more (meth)acryloyl groups and one or more (total number of cyclic ether groups and cyclic thioether groups) cyclic ether groups or cyclic thioether groups, more preferably has one or more (meth)acryloyl groups and one or more epoxy groups or thiirane groups, and preferably has one or more (meth)acryloyl groups and one or more cyclic ether groups and more preferably has one or more (meth)acryloyl groups and one or more epoxy groups. The photocurable and thermosetting compound may have a cyclic thioether group. As the photocurable and thermosetting compound, only one type may be used, or a combination of at least two types may also be used.

The photocurable compound, the first photocurable compound, the second photocurable compound and the thermosetting compound are compounded as components different from the photocurable and thermosetting compound.

The photocurable and thermosetting compound is not particularly limited, and examples thereof include a compound having a (meth)acryloyl group and an epoxy group, a partially (meth)acrylated product of an epoxy compound, and a urethane-modified (meth)acrylic epoxy compound.

The compound having a (meth)acryloyl group and an epoxy group includes glycidyl (meth)acrylate, and 4-hydroxybutyl (meth)acrylate glycidyl ether.

The partially (meth)acrylated product of an epoxy compound can be obtained by reacting the epoxy compound with a (meth)acrylic acid in the presence of a catalyst according to a normal method. Examples of an epoxy compound capable of being used for the partially (meth)acrylated product of an epoxy compound include novolac type epoxy compounds, bisphenol type epoxy compounds and the like. Examples of the novolac type epoxy compounds include phenol novolac type epoxy compounds, cresol novolac type epoxy compounds, biphenyl novolac type epoxy compounds, trisphenol novolac type epoxy compounds, and dicyclopentadiene novolac type epoxy compounds. Examples of the bisphenol type epoxy compounds include a bisphenol A epoxy compound, a bisphenol F epoxy compound, a 2,2'-diallylbisphenol A epoxy compound, a hydrogenated bisphenol epoxy compound, and a polyoxypropylene bisphenol A epoxy compound. It is possible to obtain an epoxy compound having a desired acrylation ratio by appropriately changing a mixing rate of an epoxy compound and a (meth)acrylic acid. The mixing rate of the (meth)acrylic acid per 1 equivalent of an epoxy group is preferably 0.1 equivalent or more, more preferably 0.2 equivalent or more, and preferably 0.7 equivalent or less and more preferably 0.5 equivalent or less.

The urethane-modified (meth)acrylic epoxy compound can be obtained, for example, by the following method. A polyol is reacted with difunctional or more isocyanate, and a (meth)acrylic monomer having an acid group and glycidol are further reacted with a residual isocyanate group. Or, a (meth)acrylic monomer having a hydroxyl group and glycidol may be reacted with the difunctional or more isocyanate without using a polyol. Or, the urethane-modified (meth)acrylic epoxy compound can also be obtained by reacting a (meth)acrylate monomer having an isocyanate group with glycidol.

Specifically, for example, first, 1 mole of trimethylolpropane and 3 mole of isophorone diisocyanate are reacted under the catalytic influence of a Sn-based catalyst. The urethane-modified (meth)acrylic epoxy compound can be obtained by reacting the isocyanate group remaining in the resulting compound with hydroxyethyl acrylate which is an acrylic monomer having a hydroxyl group and glycidol which is epoxy having a hydroxyl group.

The above-mentioned polyol is not particularly limited, and examples thereof include ethylene glycol, glycerin, sorbitol, trimethylolpropane, and (poly)propylene glycol.

The above-mentioned isocyanate is not particularly limited as long as it is difunctional or more. Examples of the isocyanates include isophorone diisocyanate, 2,4-trylene diisocyanate, 2,6-trylene diisocyanate, hexamethylene diisocyanate, trimethylhexamethylene diisocyanate, 4,4'-diphenylmethane diisocyanate (MDI), hydrogenated MDI, polymeric MDI, 1,5-naphthalene diisocyanate, norbornane diisocyanate, tolidine diisocyanate, xylylene diisocyanate (XDI), hydrogenated XDI, lysine diisocyanate, triphenylmethane triisocyanate, tris(isocyanatophenyl)thiophosphate, tetramethylxylene diisocyanate, and 1,6,10-undecane triisocyanate.

The above-mentioned compound having a (meth)acryloyl group and a cyclic thioether group can be obtained, for example, by converting the epoxy group of the above-mentioned compound having a (meth)acryloyl group and an epoxy group to a cyclic thioether group. As a method of converting the epoxy group to the cyclic thioether group, a method is preferred in which a solution containing the compound having a (meth)acryloyl group and an epoxy group is continuously or intermittently added to a first solution containing a sulfurizing agent, and then a second solution containing a sulfurizing agent is further continuously or intermittently added. The above-mentioned epoxy group can be converted to a cyclic thioether group by this method.

Examples of the sulfurizing agent include thiocyanates, thioureas, phosphine sulfide, dimethylthioformamide and N-methylbenzothiazole-2-thione. Examples of the thiocyanates include sodium thiocyanate, potassium thiocyanate and sodium thiocyanate.

From the viewpoint of further increasing the thickness accuracy of the cured adhesive layer and further suppressing the occurrence of voids, the photocurable and thermosetting compound preferably contains 4-hydroxybutyl (meth)acrylate glycidyl ether, and more preferably contains 4-hydroxybutyl acrylate glycidyl ether.

From the viewpoint of forming the cured adhesive layer with higher accuracy, in 100 wt % of the adhesive, the content of the photocurable and thermosetting compound is preferably 0.5 wt % or more, more preferably 1 wt % or more, and preferably 80 wt % or less and more preferably 70 wt % or less, and the content of 4-hydroxybutyl (meth) acrylate glycidyl ether is preferably 0.5 wt % or more, more preferably 1 wt % or more, and preferably 80 wt % or less and more preferably 70 wt % or less.

From the viewpoint of forming the cured adhesive layer with higher accuracy the total content of the photocurable compound, and the photocurable and thermosetting compound is preferably 10 wt % or more, more preferably 20 wt % or more, and preferably 80 wt % or less and more preferably 70 wt % or less in 100 wt % of the adhesive.

(Thermosetting Compound)

Examples of the thermosetting compound include a thermosetting compound having a cyclic ether group and a thermosetting compound having a cyclic thioether group such as a thiirane group. From the viewpoint of forming the cured adhesive layer with higher accuracy, as the thermosetting compound, a thermosetting compound having one or more (total number of cyclic ether groups and cyclic thioether groups) cyclic ether groups or cyclic thioether groups is used. The thermosetting compound having a cyclic ether group is more preferably a thermosetting compound having an epoxy group (epoxy compound). The thermosetting compound may be a thermosetting compound having a cyclic thioether group. As the thermosetting compound, only one type may be used, or a combination of at least two types may also be used.

The above-mentioned epoxy compound is not particularly limited, and examples thereof include novolac type epoxy compounds, bisphenol type epoxy compounds and the like. Examples of the novolac type epoxy compounds include phenol novolac type epoxy compounds, cresol novolac type epoxy compounds, biphenyl novolac type epoxy compounds, trisphenol novolac type epoxy compounds, and dicyclopentadiene novolac type epoxy compounds. Examples of the bisphenol type epoxy compounds include a bisphenol A epoxy compound, a bisphenol F epoxy compound, a 2,2'-diallylbisphenol A epoxy compound, a hydrogenated bisphenol epoxy compound, and a polyoxypropylene bisphenol A epoxy compound. Further, examples of the epoxy compound in addition to these include alicyclic epoxy compound and glycidyl amines. As the epoxy compound, only one type may be used, or a combination of at least two types may also be used.

The thermosetting compound having a cyclic thioether group can be obtained, for example, by converting an epoxy group of the epoxy compound having an epoxy group to a cyclic thioether group. As a method of converting the epoxy group to the cyclic thioether group, a method is preferred in which a solution containing the epoxy compound having an epoxy group is continuously or intermittently added to a first solution containing a sulfurizing agent, and then a second solution containing a sulfurizing agent is further continuously or intermittently added. The above-mentioned epoxy group can be converted to a cyclic thioether group by this method.

Examples of the sulfurizing agent include thiocyanates, thioureas, phosphine sulfide, dimethylthioformamide and N-methylbenzothiazole-2-thione. Examples of the thiocyanates include sodium thiocyanate, potassium thiocyanate and sodium thiocyanate.

From the viewpoint of forming the adhesive layer with higher accuracy and further suppressing generation of voids in the adhesive layer, the thermosetting compound preferably has an aromatic skeleton.

From the viewpoint of the further enhancement of adhesiveness, moisture-resistant adhesion reliability and cooling/heating cycle reliability by further suppressing of voids, the thermosetting compound having one or more cyclic ether groups is preferably solid at 25° C. From the viewpoint of the further enhancement of adhesiveness, moisture-resistant adhesion reliability and cooling/heating cycle reliability by further suppressing of voids, a softening point of the thermosetting compound having one or more cyclic ether groups is preferably 25° C. or higher, more preferably 30° C. or higher, and moreover preferably 40° C. or higher. An upper limit of the softening point is not particularly limited. The softening point of the thermosetting compound having one or more cyclic ether groups is preferably 150° C. or lower.

The softening point can be measured according to JIS K 7234.

From the viewpoint of forming the cured adhesive layer with higher accuracy, the content of the thermosetting compound is preferably 10 wt % or more, more preferably 20 wt % or more, and preferably 80 wt % or less and more preferably 70 wt % or less in 100 wt % of the adhesive.

(Photo-Radical Initiator)

Example of a photopolymerization initiator includes a photo-radical polymerization initiator, a photo-cationic polymerization initiator or the like. In the present invention, as the photopolymerization initiator, a photo-radical polymerization initiator is used. As the photo-radical initiator, only one type may be used, or a combination of at least two types may also be used.

The photo-radical polymerization initiator is not particularly limited. The photo-radical polymerization initiator is a compound which can generate radicals by light irradiation to initiate a radical polymerization reaction. Specific examples of the photo-radical polymerization initiator include benzoin compounds such as benzoin, benzoin methyl ether, benzoin ethyl ether, and benzoin isopropyl ether; alkyl phenone compounds such as 2-hydroxy-2-methyl-1-phenyl-propan-1-one; acetophenone compounds such as acetophenone, 2,2-dimethoxy-2-phenyl acetophenone, 2,2-diethoxy-2-phenyl acetophenone and 1,1-dichloroacetophenone; aminoacetophenone compounds such as 2-methyl-1-[4-(methylthio) phenyl]-2-morpholino propan-1-one, 2-benzyl-2-dimethylamino-1-(4-morpholinophenyl)-butan-1-one, 2-benzyl-2-dimethylamino-1-(4-morpholinophenyl)-butanone-1,2-(dimethylamino)-2-[(4-methylphenyl)methyl]-1-[4-(4-morpholinyl)phenyl]-1-butanone and N,N-dimethylaminoacetophenone; anthraquinone compounds such as 2-methyl anthraquinone, 2-ethylanthraquinone and 2-t-butylanthraquinone; thioxanthone compounds such as 2,4-dimethyl thioxanthone, 2,4-diethyl thioxanthone, 2-chlorothioxanthone and 2,4-diisopropylthioxanthone; ketal compounds such as acetophenone dimethyl ketal and benzyl dimethyl ketal; acylphosphine oxide compounds such as 2,4,6-trimethylbenzoyldiphenylphosphine oxide and bis(2,4,6-trimethylbenzoyl)phenylphosphine oxide; oxime ester compounds such as 1,2-octanedione, 1-[4-(phenylthio)-2-(o-benzoyl oxime)], ethanone, and 1-[9-ethyl-6-(2-methyl benzoyl)-9H-carbazole-3-yl]-1-(o-acetyloxime); and titanocene compounds such as bis(cyclopentadienyl) diphenyl titanium, bis(cyclopentadienyl) dichloro titanium, bis(cyclopentadienyl)-bis(2,3,4,5,6-pentafluorophenyl)titanium and bis(cyclopentadienyl)-bis(2,6-difluoro-3-(pyrrol-1-yl)phenyl)-titanium. As the photo-radical polymerization initiator, only one type may be used, or a combination of at least two types may also be used.

A photopolymerization initiation aid may be used together with the photo-radical polymerization initiator. Examples of the photopolymerization initiation aid include N,N-dimethylaminobenzoic acid ethyl ester, N,N-dimethylaminobenzoic acid isoamyl ester, pentyl-4-dimethylaminobenzoate, triethylamine and triethanolamine. A photopolymerization initiation aid other than the above-mentioned compounds may also be used. As the photopolymerization initiation aid, only one type may be used, or a combination of at least two types may also be used.

The content of the photo-radical initiator is preferably 0.1 wt % or more, more preferably 0.2 wt % or more, and preferably 10 wt % or less and more preferably 5 wt % or less in 100 wt % of the adhesive.

(Compound Capable of Reacting with Thermosetting Compound)

The above-mentioned compound capable of reacting with the thermosetting compound is preferably a thermal curing agent. The compound capable of reacting with the thermosetting compound contains aromatic amine. The aromatic amine is an amine compound having an aromatic skeleton. As the compound capable of reacting with the thermosetting compound, only one type may be used, or a combination of at least two types may also be used.

Examples of the compound capable of reacting with the thermosetting compound include an organic acid, an amine compound, an amide compound, a hydrazide compound, an imidazole compound, an imidazoline compound, a phenol compound, a urea compound, a polysulfide compound and an acid anhydride. As the compound capable of reacting with the thermosetting compound, a modified polyamine compound such as an amine-epoxy adduct may be used. A thermal curing agent other than these compounds may also be used.

The amine compound means a compound having one or more primary to tertiary amino groups. Examples of the amine compound include (1) aliphatic amines, (2) alicyclic amines, (3) aromatic amines, (4) hydrazide, and (5) guanidine derivatives. Further, it is also possible to use adducts, such as an epoxy-compound-added polyamine (reaction product between an epoxy compound and a polyamine), a Michael-added polyamine (reaction product between α,β-unsaturated ketone and a polyamine), a Mannich-added polyamine (condensate of a polyamine, formalin, and phenol), a thiourea-added polyamine (reaction product between thiourea and a polyamine), and a ketone-blocked polyamine (reaction product between a ketone compound and a polyamine [ketimine]).

Examples of the above (1) aliphatic amines include diethylenetriamine, triethylenetetramine, tetraethylenepentamine, and diethylamino propylamine.

Examples of the above (2) alicyclic amines include menthenediamine, isophoronediamine, N-aminoethylpiperazine, 3,9-bis(3-aminopropyl)-2,4,8,10-tetraoxaspiro(5,5)undecane adduct, bis(4-amino-3-methylcyclohexyl)methane, and bis(4-aminocyclohexyl)methane.

Examples of the above (3) aromatic amines include 1,3-diaminotoluene, 1,4-diaminotoluene, 2,4-diaminotoluene, 3,5-diethyl-2,4-diaminotoluene, 3,5-diethyl-2,6-diaminotoluene, 2,4-diaminoanisole, 4,4'-diaminodiphenylmethane, 4,4'-diaminodiphenylsulfone, 4,4'-methylene-bis[2-chloroaniline], 4,4'-diaminodiphenyl ether, 2,2-bis[4-(4-aminophenoxy)phenyl]propane, bis[4-(4-aminophenoxy)phenyl]sulfone, 1,3-bis(4-aminophenoxy)benzene, methylenebis(2-ethyl-6-methylaniline), 3,3'-diethyl-4,4'-diaminodiphenylmethane, and 3,3',5,5'-tetraethyl-4,4'-diaminodiphenylmethane.

Examples of the above (4) hydrazides include carbodihydrazide, adipic acid dihydrazide, sebacic acid dihydrazide, dodecanedioic acid dihydrazide, and isophthalic acid dihydrazide.

Examples of the above (5) guanidine derivatives include dicyandiamide, 1-o-tolyldiguanide, α-2,5-dimethylguanide, α,ω-diphenyldiguanizide, α,α-bisguanyl guanidino diphenyl ether, p-chlorophenyldiguanide, α,α-hexamethylene bis[ω-(p-chlorophenol)]diguanide, phenyldiguanide oxalate, acetylguanidine, and diethylcyanoacetylguanidine.

The above-mentioned phenolic compound includes polyhydric phenolic compounds. Examples of the polyhydric phenolic compounds include phenol, cresol, ethylphenol, butylphenol, octylphenol, bisphenol A, tetrabromobisphenol A, bisphenol F, bisphenol S, 4,4'-biphenylphenol, a naphthalene skeleton-containing phenol novolac resin, a xylylene skeleton-containing phenol novolac resin, a dicyclopentadiene skeleton-containing phenol novolac resin, and a fluorene skeleton-containing phenol novolac resin.

Examples of the above-mentioned acid anhydrides include phthalic anhydride, tetrahydrophthalic anhydride, hexahydrophthalic anhydride, methyltetrahydrophthalic anhydride, methylnadic anhydride, dodecylsuccinic anhydride, chlorendic anhydride, pyromellitic dianhydride, benzophenone tetracarboxylic anhydride, methylcyclohexene tetracarboxylic anhydride, trimellitic anhydride, and polyazelaic anhydride.

The above-mentioned compound capable of reacting with the thermosetting compound can be appropriately used; however, in the present invention, at least aromatic amine is used.

From the viewpoint of the further enhancement of adhesiveness, moisture-resistant adhesion reliability and cooling/heating cycle reliability by further suppressing of voids, the aromatic amine is preferably solid at 25° C. From the viewpoint of the further enhancement of adhesiveness, moisture-resistant adhesion reliability and cooling/heating cycle reliability by further suppressing of voids, a melting point of the aromatic amine is preferably 40° C. or higher, more preferably 50° C. or higher, and moreover preferably 60° C. or higher. An upper limit of the melting point is not particularly limited. The melting point of the aromatic amine is preferably 200° C. or lower.

The melting point in the present specification means a temperature (° C.) at which a solid is melted and becomes liquid in an inert atmosphere. The melting point of aromatic amine can be measured by a differential scanning calorimetry (DSC) and is a value measured at a temperature raising rate of 5° C./min using a differential scanning calorimeter "DSC220C" (manufactured by Seiko Instrument Inc.).

From the viewpoint of the further enhancement of adhesiveness, moisture-resistant adhesion reliability and cooling/heating cycle reliability by further suppressing of voids, the aromatic amine preferably has two or more amino groups.

The content of the compound capable of reacting with the thermosetting compound is preferably 1 wt % or more, more preferably 5 wt % or more, and preferably 60 wt % or less and more preferably 50 wt % or less in 100 wt % of the adhesive.

From the viewpoint of the further enhancement of adhesiveness, moisture-resistant adhesion reliability and cooling/heating cycle reliability by further suppressing of voids, the content of the aromatic amine is preferably 1 wt % or more, more preferably 5 wt % or more, and preferably 60 wt % or less and more preferably 50 wt % or less in 100 wt % of the adhesive.

(Curing Accelerator)

Examples of the above-mentioned curing accelerators include tertiary amine, imidazole, quaternary ammonium salts, quaternary phosphonium salts, organic metal salts, phosphorus compounds, and urea compounds.

The content of the curing accelerator is preferably 0.01 wt % or more, more preferably 0.1 wt % or more, and preferably 10 wt % or less and more preferably 5 wt % or less in 100 wt % of the adhesive.

(Solvent)

The adhesive does not include or includes a solvent. The adhesive may include a solvent or does not have to include a solvent. From the viewpoint of further increasing the thickness accuracy of the adhesive layer and further suppressing generation of voids in the adhesive layer, a lower content of the solvent in the adhesive is preferred.

The solvent includes water and an organic solvent. From the viewpoint of the further enhancement of removability of a residual material, the organic solvent is preferred. Examples of the organic solvent include alcohols such as ethanol; ketones such as acetone, methyl ethyl ketone and cyclohexanone; aromatic hydrocarbons such as toluene, xylene and tetramethylbenzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether and tripropylene glycol monomethyl ether; esters such as ethyl acetate, butyl acetate, butyl lactate, cellosolve acetate, butyl cellosolve acetate, carbitol acetate, butyl carbitol acetate, propylene glycol monomethyl ether acetate, dipropylene glycol monomethyl ether acetate and propylene carbonate; aliphatic hydrocarbons such as octane and decane; and petroleum base solvents such as petroleum ether and naphtha.

When the adhesive includes the solvent, the content of the solvent is preferably 5 wt % or less, more preferably 1 wt % or less, and moreover preferably 0.5 wt % or less in 100 wt % of the adhesive.

(Filler)

The adhesive does not include or includes fillers. The adhesive may include the fillers or does not have to include the fillers. From the viewpoint of further increasing the thickness accuracy of the adhesive layer and further suppressing generation of voids in the adhesive layer, a lower content of the filler in the adhesive is preferred. Moreover, a lower content of the fillers in the adhesive enables to suppress the occurrence of defective ejection of an inkjet device.

Examples of a material of the filler include silica, talc, clay, mica, hydrotalcite, alumina, magnesium oxide, aluminum hydroxide, aluminum nitride and boron nitride.

When the adhesive includes the filler, the content of the filler is preferably 5 wt % or less, more preferably 1 wt % or less, and moreover preferably 0.5 wt % or less in 100 wt % of the adhesive.

(Other Components)

The adhesive may include other components. Other components are not particularly limited, and examples thereof include adhesion aids such as a coupling agent, pigment, dye, a levelling agent, an antifoaming agent and a polymerization inhibitor.

(Specific Example of Electronic Component)

Hereinafter, other specific examples of an electronic component prepared using the inkjet adhesive of an embodiment of the present invention will be described.

FIG. 6 is a front sectional view schematically showing a first variation of an electronic component prepared using the inkjet adhesive of an embodiment of the present invention.

The semiconductor device 71 shown in FIG. 6 is an electronic component. The semiconductor device 71 includes a substrate 53A, an adhesive layer 72 and a first semiconductor wafer 73. The substrate 53A has a first connection terminal 53a on surface thereof. The first semiconductor wafer 73 has a connection terminal 73a on surface thereof. The substrate 53A is formed in the same manner as in a substrate 53 described later except for not providing the second connection terminal 53b.

A first semiconductor wafer 73 is laminated on the substrate 53A with the adhesive layer 72 interposed therebetween. The adhesive layer 72 is formed by photo-curing and thermally curing the adhesive.

The first semiconductor wafer 73 has a connection terminal 73a on an upper surface of the first semiconductor wafer. A wiring 74 is led-out from the connection terminal 73a. The connection terminal 73a is electrically connected to the first connection terminal 53a by the wiring 74.

FIG. 7 is a front sectional view schematically showing a second variation of an electronic component prepared using the inkjet adhesive of an embodiment of the present invention.

The semiconductor device 51 shown in FIG. 7 is an electronic component. The semiconductor device 51 includes a laminate structure 52. The laminate structure 52 has a substrate 53, an adhesive layer 54 and a second semiconductor wafer 55 laminated on the substrate 53 with the adhesive layer 54 interposed therebetween. The second semiconductor wafer 55 is arranged on the substrate 53. The second semiconductor wafer 55 is indirectly laminated on the substrate 53. In a planar view, the substrate 53 is larger than the second semiconductor wafer 55. The substrate 53 has a region extending sideward out of the second semiconductor wafer 55.

The adhesive layer 54 is formed, for example, by curing a curable composition. A curable composition layer before curing which uses a curable composition may have tackiness. A curable composition sheet may be used for forming the curable composition layer before curing.

The substrate 53 has a first connection terminal 53a on an upper surface of the substrate. The second semiconductor wafer 55 has a connection terminal 55a on an upper surface of the second semiconductor wafer. A wiring 56 is led-out from the connection terminal 55a. One end of the wiring 56 is connected to the connection terminal 55a provided on the second semiconductor wafer 55. The other end of the wiring 56 is connected to a first connection terminal 53a provided on the substrate 53. The connection terminal 55a is electrically connected to the first connection terminal 53a by the wiring 56. The other end of the wiring 56 may be connected to another connection terminal other than the first connection terminal 53a. The wiring 56 is preferably a bonding wire.

A first semiconductor wafer 62 is laminated on the second semiconductor wafer 55 in the laminate structure 52 with the adhesive layer 61 interposed therebetween. The adhesive layer 61 is formed by photo-curing and thermally curing the adhesive.

The substrate 53 has a second connection terminal 53b on an upper surface of the substrate. The first semiconductor wafer 62 has a connection terminal 62a on an upper surface of the first semiconductor wafer. A wiring 63 is led-out from the connection terminal 62a. One end of the wiring 63 is connected to the connection terminal 62a provided on the first semiconductor wafer 62. The other end of the wiring 63 is connected to a second connection terminal 53b provided on the substrate 53. The connection terminal 62a is electrically connected to the second connection terminal 53b by the wiring 63. The other end of the wiring 63 may be connected to another connection terminal other than the second connection terminal 53b. The wiring 63 is preferably a bonding wire.

The semiconductor device 51 can be formed by ejecting an adhesive which has photocurability and heat-curability, and is liquid from an inkjet device to the second semiconductor wafer 55 to form an adhesive layer 61. On the other hand, the semiconductor device 71 can be formed by ejecting an adhesive which has photocurability and heat-curability, and is liquid from an inkjet device to the substrate 53A to form an adhesive layer 72.

Hereinafter, the present invention will be specifically explained by way of examples and comparative examples. The present invention is not limited to the following examples.

Synthesis of Compound Having Thiirane Group (A):

Into a 2 l reactor equipped with a stirrer, a cooler and a thermometer, 250 ml of ethanol, 250 ml of pure water and 20 g of potassium thiocyanate were charged, and potassium thiocyanate was dissolved to prepare a first solution.

Thereafter, a temperature within the reactor was maintained in a range of 20° C. to 25° C. Then, 160 g of a bisphenol A epoxy resin was added dropwise at an addition rate of 5 ml/min while stirring the first solution in the reactor maintained at a temperature of 20° C. to 25° C. After dropwise addition, the resulting mixture was further stirred for 30 minutes to obtain an epoxy compound-containing mixed solution. Next, a second solution formed by dissolving 20 g of potassium thiocyanate in a solution containing 100 ml of pure water and 100 ml of ethanol was prepared. The resulting second solution was added to the obtained epoxy compound-containing mixed solution at an addition rate of 5 ml/min, and then the resulting mixture was stirred for 30 minutes. After stirring, the second solution formed by dissolving 20 g of potassium thiocyanate in a solution containing 100 ml of pure water and 100 ml of ethanol was further prepared, and further charged into the reactor at a rate of 5 ml/minute, and the resulting mixture was stirred for 30 minutes. Thereafter, the temperature within a reaction container was lowered to 10° C. by cooling, and the mixture was stirred for 2 hours to react the solution. Next, 100 ml of saturated saline solution was charged into the reaction container and the resulting mixture was stirred for 10 minutes. After stirring, 300 ml of toluene was further added and the resulting mixture was stirred for 10 minutes. Thereafter, the solution in the container was transferred to a separatory funnel and left standing for 2 hours to separate the solution. A solution at a lower portion in the separatory funnel was drained out, and a supernatant solution was taken out. To the taken out supernatant solution, 100 ml of toluene was added, and the resulting mixture was stirred and left standing for 2 hours. Further, 100 ml of toluene was further added, and the resulting mixture was stirred and left standing for 2 hours. Next, 50 g of magnesium sulfate was added to the supernatant solution containing added toluene and the resulting mixture was stirred for 5 minutes. After stirring, magnesium sulfate was removed with a filter paper and the solution was separated. Using a vacuum drier, the separated solution was dried at 80° C. at a reduced pressure to remove a remaining solvent. Thus, a compound having a thiirane group (A) in which an epoxy group is substituted with a thiirane group which is liquid at 25° C. was obtained.

Synthesis of Compound Having Thiirane Group (B):

A compound having a thiirane group (B) in which an epoxy group is substituted with a thiirane group which is liquid at 25° C., was obtained by the same operation as in Synthesis of Compound Having Thiirane Group (A) except for changing the bisphenol A epoxy resin to 4-hydroxybutyl acrylate glycidyl ether in Synthesis of Compound Having Thiirane Group (A).

Example 1

Preparation of Adhesive A:

Two parts by weight of tricyclodecane dimethanol diacrylate (IRR-214K, manufactured by DAICEL-ALLNEX LTD.), 11 parts by weight of 2-ethylhexyl acrylate (AEH, manufactured by NIPPON SHOKUBAI CO., LTD.), respectively as a photocurable compound, 41 parts by weight of 4-hydroxybutyl acrylate glycidyl ether (4HBAGE, manufactured by Nippon Kasei Chemical Co., Ltd.) as a photocurable and thermosetting compound, 20 parts by weight of a bisphenol A epoxy resin (YD-127, manufactured by NIPPON STEEL & SUMIKIN CHEMICAL CO., LTD.) as a thermosetting compound, 15 parts by weight of aromatic amine (EH-105L, manufactured by ADEKA CORPORATION) as a thermal curing agent, 1 part by weight of DBU/octanoic acid salt (UCAT SA 102, manufactured by San-Apro Ltd.) as a curing accelerator, and 5 parts by weight of 2-benzyl-2-dimethylamino-1-(4-morpholinophenyl)-butanone-1 (IRGACURE 369, manufactured by BASF CORPORATION) as a photopolymerization initiator were uniformly mixed to obtain an adhesive A.

Examples 2 to 25 and Comparative Examples 1 and 2

Adhesives B to W and AA to AD shown in Tables 2 and 3 below were obtained in the same manner as in Example 1 except for changing a type and a compounding amount of each compounding component as shown in Tables 1 to 4 below.

(Die Shear Strength after B-Staging)

An adhesive layer was formed on a silicon wafer undergoing the steps shown in FIGS. 2(a) to 2(e) according to the above-mentioned method for producing an electronic component. An adhesive layer of 3 mm long, 3 mm wide and 30 μm thick was formed by repeating the application step of applying each of the adhesives while circulating the adhesive at 70° C., and the first light irradiation step (irradiated at 100 mW/cm² for 0.1 second using a UV-LED lamp with a main wavelength of 365 nm), and the adhesive layer was photo-cured in the second light irradiation step (irradiated at 100 mW/cm² for 10 seconds using a ultra-high pressure mercury lamp). Thereafter, a silicon bare chip considered as a semiconductor chip (3 mm long, 3 mm wide and 750 μm thick) was pressed on the adhesive layer for 1 second in the conditions of a temperature of 110° C. and at a pressure of 0.1 MPa using a die bonding device to obtain a B-stage adhesion test piece. The die shear strength of the B-stage adhesion test piece was measured using a die shear strength measurement device ("Dage series 4000" manufactured by Dage Japan Co., Ltd., test temperature: 25° C.).

(Die Shear Strength after Thermal Curing)

Further, the B-stage adhesion test piece was placed in an oven at 160° C. and at a pressure of 7 atmospheres and heated for 3 hours to be thermally cured to obtain a thermally-cured adhesion test piece. The die shear strength of the thermally-cured adhesion test piece was measured using a die shear strength measurement device ("Dage series 4000" manufactured by Dage Japan Co., Ltd., test temperature: 260° C.).

(Die Shear Strength after Moisture-Resistant Adhesion Test)

The above-mentioned thermally-cured adhesion test piece was left standing for 24 hours and for 48 hours under conditions of 120° C., 100 RH % and 2 atmospheres and dried at 100° C. for 3 hours. Thereafter, the die shear strength of the adhesion test piece after the moisture-resistant adhesion test was measured using a die shear strength measurement device ("Dage series 4000" manufactured by Dage Japan Co., Ltd., test temperature: 260° C.). The die shear strength after the moisture-resistant adhesion test was rated according to the following criteria.

[Rating Criteria of Die Shear Strength after Moisture-Resistant Adhesion Test]

○○: Reduction in adhesive power is 0% or more and less than 10%

○: Reduction in adhesive power is 10% or more and less than 50%

Δ: Reduction in adhesive power is 50% or more and less than 70% x: Reduction in adhesive power is 70% or more.

(Check of Voids of Semiconductor Device)

A BGA substrate (thickness 0.3 mm, a commercially available solder resist is applied, 80 locations (5 lines×16 rows) are provided on which a semiconductor chip with a size of 10 mm×10 mm is placed) having a height difference of wiring of 5 μm was prepared. An adhesive layer was formed undergoing the steps shown in FIGS. 2(a) to 2(e) according to the above-mentioned method for producing an electronic component. An adhesive layer of 10 mm long, 10 mm wide and 30 μm thick was formed by repeating the application step of applying each of the adhesives while circulating the adhesive at 70° C., and the first light irradiation step (irradiated at 100 mW/cm² for 0.1 second using a UV-LED lamp with a main wavelength of 365 nm), and the adhesive layer was photo-cured in the second light irradiation step (irradiated at 100 mW/cm² for 10 seconds using a ultra-high pressure mercury lamp). Thereafter, a silicon bare chip considered as a semiconductor chip (10 mm long, 10 mm wide and 80 μm thick) was pressed on the adhesive layer for 1 second in the conditions of a temperature of 110° C. and at a pressure of 0.1 MPa using a die bonding device to obtain a laminate. After the silicon bare chip was laminated, it was confirmed that protrusion of the adhesive layer was less than 100 μm using an optical microscope ("Digital Microscope VH-Z100" manufactured by KEYENCE CORPORATION). The obtained laminates were placed in an oven at 160° C. and at a pressure of 7 atoms and heated for 3 hours to be thermally cured to obtain 80 semiconductor devices (laminate structure).

Voids of the adhesive layer in the obtained semiconductor device were observed using an ultrasonic inspection imaging device ("mi-scope hyper II" manufactured by Hitachi Kenki Fine Tec Co., Ltd.), and evaluated according to the following criteria.

[Evaluation Criteria of Void]

○○: Void was little observed

○: Void was observed slightly (there is no problem for use)

x: Void was observed (there is a problem for use)

(Moisture Absorption/Reflow and Cooling/Heating Cycle Reliability Test of Semiconductor Device)

Each of semiconductor devices (80 pieces) obtained in evaluation of Check of Voids of Semiconductor Device was left standing at 85° C. and 85 RH % for 168 hours to take up moisture, and then the semiconductor device was passed through a solder reflow furnace (preheating: 150° C., 100 seconds, reflowing: "maximum temperature 260° C.") five times. Using a liquid to liquid thermal shock chamber ("TSB-51" manufactured by ESPEC CORPORATION), the semiconductor device subjected to the moisture absorption/reflow test was subjected to a cooling/heating cycle test following a process in which the semiconductor device was held at −55° C. for 10 minutes, and then a temperature of the semiconductor device was raised to 150° C., maintained at 150° C. for 10 minutes, and then lowered to −50° C. as one cycle. The semiconductor device was taken out after 250 cycles, 500 cycles and 1000 cycles, and peeling of the adhesive layer of the semiconductor device was observed using an ultrasonic inspection imaging device ("mi-scope hyper II" manufactured by Hitachi Kenki Fine Tec Co., Ltd.), and evaluated according to the following criteria.

[Evaluation Criteria of Moisture Absorption/Reflow and Cooling/Heating Cycle Evaluation]

○○: not peeled off

○: peeled off slightly (there is no problem for use)

x: peeled off heavily (there is a problem for use)

Details of compounding components used are shown in Table 1 below, and composition and results are shown in Tables 2, 3 and 4 below. The unit of the compounding components was a part by weight.

TABLE 1

| Photocurable Compound | Polyfunctional (Meth)acrylate | IRR-214K | Tricyclodecanedimethanol diacrylate | Manufactured by DAICEL-ALLNEX LTD. |
|---|---|---|---|---|
| | | TMPTA | Trimethylolpropane triacrylate | Manufactured by DAICEL-ALLNEX LTD. |
| | | EBECRYL 210 | Difunctional aromatic urethane acrylate | Manufactured by DAICEL-ALLNEX LTD. |
| | Monofunctional (Meth)acrylate | AEH | 2-ethylhexyl acrylate | Manufactured by NIPPON SHOKUBAI CO., LTD. |
| | | L-A | Lauryl acrylate | Manufactured by KYOEISHA CHEMICAL CO., LTD. |

TABLE 1-continued

| | | | |
|---|---|---|---|
| Photocurable and Thermosetting Compound | 4HBAGE | 4-hydroxybutyl acrylate glycidyl ether | Manufactured by Nippon Kasei Chemical Co., Ltd. |
| | BLEMMERGH | Glycidyl (meth)acrylate | Manufactured by NOF CORPORATION |
| | — | Compound having a thiirane group (B) | Manufactured by SEKISUI CHEMICAL CO., LTD. |
| Thermosetting Compound | YD-127 | Bisphenol A epoxy resin (liquid at 25° C.) | Manufactured by NIPPON STEEL & SUMIKIN CHEMICAL CO., LTD. |
| | EP-4088S | Dicyclopentadiene type epoxy resin (liquid at 25° C.) | Manufactured by ADEKA CORPORATION |
| | JER630 | Glycidyl amine type epoxy resin (liquid at 25° C.) | Manufactured by Mitsubishi Chemical Corporation |
| | HP7200L | Dicyclopentadiene type epoxy resin (softening point; 55° C.) | Manufactured by DIC CORPORATION |
| | HP-7200HHH | Dicyclopentadiene type epoxy resin (softening point; 105° C.) | Manufactured by DIC CORPORATION |
| | N-770 | Phenol novolac type epoxy resin (softening point; 70° C.) | Manufactured by DIC CORPORATION |
| | N-670 | Cresol novolac type epoxy resin (softening point; 72° C.) | Manufactured by DIC CORPORATION |
| | HP-4770 | Naphthalene type epoxy resin (softening point; 74° C.) | Manufactured by DIC CORPORATION |
| | — | Compound having a thiirane group (A) (liquid at 25° C.) | Manufactured by SEKISUI CHEMICAL CO., LTD. |
| Thermal Curing Agent | EN-105L | Aromatic amine (liquid at 25° C.) | Manufactured by ADEKA CORPORATION |
| | EPICURE W | Aromatic amine (liquid at 25° C.) | Manufactured by Mitsubishi Chemical Corporation |
| | DETDA | Diethyltoluenediamine (liquid at 25° C.) | Manufactured by MITSUI FINE CHEMICALS, Inc. |
| | 4,4'-DADPE | 4,4'-diaminodiphenyl ether (melting point; 192° C.) | Manufactured by MITSUI FINE CHEMICALS, Inc. |
| | APB-N | 1,3-bis(3-aminophenoxy)benzene (melting point; 109° C.) | Manufactured by MITSUI FINE CHEMICALS, Inc. |
| | 3,3'-DAS | 3,3'-diamdnodiphenylsulfone (melting point; 170° C.) | Manufactured by MITSUI FINE CHEMICALS, Inc. |
| | CUREHARD-MED | Methylenebis-(2-ethyl-6-methylaniline) (melting point; 84° C.) | Manufactured by IHARA CHEMICAL INDUSTRY CO., LTD. |
| | 1B2PZ | 1-benzyl-2-phenylimidazole | Manufactured by SHIKOKU CHEMICALS CORPORATION |
| | 2E4MZ | 2-ethyl-4-methylimidazole | Manufactured by SHIKOKU CHEMICALS CORPORATION |
| Photopolymerization Initiator | IRGACURE369 | 2-benzyl-2-(dimethylamino)-1-[4-(morpholino) phenyl]-butanone-1 | Manufactured by BASF CORPORATION |
| Curing Accelerator | UCAT SA-102 | DBU/octanoic acid salt | Manufactured by San-Apro Ltd. |

TABLE 2

| Compounding Component (part by weight) | | | Example 1 Adhesive A | Example 2 Adhesive B | Example 3 Adhesive C | Example 4 Adhesive D | Example 5 Adhesive E | Example 6 Adhesive F | Example 7 Adhesive G | Example 8 Adhesive H | Example 9 Adhesive I | Example 10 Adhesive J | Example 11 Adhesive K |
|---|---|---|---|---|---|---|---|---|---|---|---|---|---|
| Photocurable Compound | Polyfunctional (Meth)acrylate | IRR-214K | 2 | 2 | 2 | 2 | 2 | 2 | 2 | 2 | 2 | 2 | 2 |
| | | TMPTA | 11 | 11 | 11 | 11 | 11 | 11 | 11 | 11 | 11 | 11 | 11 |
| | | EBECRYL 210 | | | | | | | | | | | |
| | Monofunctional (Meth)acrylate | AEH | 41 | 41 | 41 | 41 | 41 | 41 | 41 | 41 | 41 | 41 | 41 |
| | | L-A | | | | | | | | | | | |
| Photocurable and Thermosetting Compound | | 4HBAGE | | | | | | | | | | | |
| | | BLEMMER GH | | | | | | | | | | | |
| | | Compound having a thiirane group (B) | | | | | | | | | | | |
| Thermosetting Compound | | YD-127 | 20 | | | | | | | | | | |
| | | EP-4088S | | 20 | | | | | | | | | |
| | | JER630 | | | 20 | | | | | | | | |
| | | HP7200L | | | | 20 | | | | | | | |
| | | HP-7200HHH | | | | | 20 | | | | | | |
| | | N-770 | | | | | | 20 | | | | | |
| | | N-670 | | | | | | | 20 | | | | |
| | | HP-4770 | | | | | | | | 20 | | | |
| | | Compound having a thiirane group (A) | | | | | | | | | 20 | 20 | 20 |
| Thermal Curing Agent | | EH-105L | 15 | 15 | 15 | 15 | 15 | 15 | 15 | 15 | | | |
| | | EPICURE W | | | | | | | | | | | |
| | | DETDA | | | | | | | | | 15 | | |
| | | 4,4'-DADPE | | | | | | | | | | 15 | |
| | | APB-N | | | | | | | | | | | |
| | | 3,3'-DAS | | | | | | | | | | | 20 |
| | | CUREHARD-MED | | | | | | | | | | | |
| | | 1B2PZ | | | | | | | | | | | |
| | | 2E4MZ | | | | | | | | | | | |
| Photopolymerization Initiator | | IRGACURE369 | 5 | 5 | 5 | 5 | 5 | 5 | 5 | 5 | 5 | 5 | 5 |
| Curing Accelerator | | UCAT SA-102 | 1 | 1 | 1 | 1 | 1 | 1 | 1 | 1 | 1 | 1 | 1 |
| Evaluation | Die Shear Strength after B-Staging (N) | | 1.4 | 1.1 | 1.2 | 2.5 | 2.7 | 2.4 | 2.4 | 2.3 | 2.4 | 2.3 | 20.7 |
| | Die Shear Strength after Thermal Curing (N) | | 64 | 65 | 68 | 72 | 71 | 70 | 70 | 72 | 70 | 72 | 96 |
| | Die Shear Strength after Moisture-Resistant Adhesion Test (24 hours) | | ○○ | ○○ | ○○ | ○○ | ○○ | ○○ | ○○ | ○○ | ○○ | ○○ | ○○ |
| | Die Shear Strength after Moisture-Resistant Adhesion Test (48 hours) | | ○ | ○ | ○ | ○ | ○ | ○ | ○ | ○ | ○ | ○ | ○ |
| | Check of Voids of Semiconductor Device | | ○○ | ○○ | ○○ | ○○ | ○○ | ○○ | ○○ | ○○ | ○○ | ○○ | ○○ |
| | Moisture Absorption/Reflow and Cooling/Heating Cycle Reliability Test [250 cycles] | | ○○ | ○○ | ○○ | ○○ | ○○ | ○○ | ○○ | ○○ | ○○ | ○○ | ○○ |
| | Moisture Absorption/Reflow and Cooling/Heating Cycle Reliability Test [500 cycles] | | ○ | ○ | ○ | ○ | ○ | ○ | ○ | ○ | ○ | ○ | ○ |
| | Moisture Absorption/Reflow and Cooling/Heating Cycle Reliability Test [1000 cycles] | | | | | | | | | | | | |

TABLE 3

| Compounding Component (part by weight) | | | Example 12 Adhesive L | Example 13 Adhesive M | Example 14 Adhesive N | Example 15 Adhesive O | Example 16 Adhesive P | Example 17 Adhesive Q | Example 18 Adhesive R | Example 19 Adhesive S | Comparative Example 1 Adhesive T | Comparative Example 2 Adhesive U | Example 20 Adhesive V | Example 21 Adhesive W |
|---|---|---|---|---|---|---|---|---|---|---|---|---|---|---|
| Photocurable Compound | Polyfunctional (Meth)acrylate | IRR-214K | 2 | 2 | 2 | 2 | 2 | 2 | 2 | 2 | 2 | 2 | 2 | 2 |
| | | TMPTA | | | | | 2 | | | | | | | |
| | | EBECRYL 210 | | | | | | | | | | | | |
| | Monofunctional (Meth)acrylate | AEH | 11 | 11 | 11 | 11 | 11 | 11 | 11 | 11 | 11 | 11 | 11 | 11 |
| | | L-A | | | | | | | | | | | | |
| Photocurable and Thermosetting Compound | | 4HBAGE | 41 | 41 | 41 | 41 | 41 | 41 | | 41 | 41 | 41 | | 41 |
| | | BLEMMER GH | | | | | | | 41 | | | | | |
| | | Compound having a thiirane group (B) | | | | | | | | | | | 41 | |
| Thermosetting Compound | | YD-127 | 20 | | | | | | | 20 | | | | |
| | | EP-4088S | | | | | | | | | | | | |
| | | JER630 | | | | | | | | | | | | |
| | | HP7200L | | | | | | | | | | | | |
| | | HP-7200HHH | | | | | | | | | | | | |
| | | N-770 | | | | 20 | | | | | | | | |
| | | N-670 | | | | | | | | | | | | |
| | | HP-4770 | | | | | | | | | | | | |
| | | Compound having a thiirane group (A) | | | | | | | | | | | | 20 |
| Thermal Curing Agent | | EH-105L | | | | | | | | | | | | |
| | | EPICURE W | | | | | | | | | | | | |
| | | DETDA | | | | | | | | | | | | |
| | | 4,4'-DADPE | 20 | | | 20 | 20 | 20 | 20 | 20 | 20 | 20 | | 20 |
| | | APB-N | | | 20 | | | | | | | | | |
| | | 3,3'-DAS | | 20 | | | | | | | | | 20 | |
| | | CUREHARD-MED | | | | | | | | | | | | |
| | | 1B2PZ | | | | | | | | | 1 | | | |
| | | 2E4MZ | | | | | | | | | | 1 | | |
| Photopolymerization Initiator | | IRGACURE369 | 5 | 5 | 5 | 5 | 5 | 5 | 5 | 5 | 5 | 5 | 5 | 5 |
| Curing Accelerator | | UCAT SA-102 | 1 | 1 | 1 | 1 | 1 | 1 | 1 | 1 | 1 | 1 | 1 | 1 |
| Evaluation | Die Shear Strength after B-Staging (N) | | 25.3 | 21.3 | 22.2 | 25.1 | 25.1 | 24.2 | 20.1 | 4.3 | 9.5 | 9.3 | 25 | 4.2 |
| | Die Shear Strength after Thermal Curing (N) | | 98 | 94 | 91 | 96 | 90 | 91 | 90 | 72 | 8 | 9 | 94 | 74 |
| | Die Shear Strength after Moisture-Resistant Adhesion Test (24 hours) | | ○○ | ○○ | ○○ | ○○ | ○○ | ○○ | ○○ | ○○ | x | x | ○○ | ○○ |
| | Die Shear Strength after Moisture-Resistant Adhesion Test (48 hours) | | ○○ | ○○ | ○○ | ○○ | ○○ | ○ | ○ | ○ | x | x | ○○ | ○ |
| | Check of Voids of Semiconductor Device | | ○○ | ○○ | ○○ | ○○ | ○○ | ○○ | ○○ | ○○ | ○ | ○ | ○○ | ○○ |
| | Moisture Absorption/Reflow and Cooling/Heating Cycle Reliability Test [250 cycles] | | ○○ | ○○ | ○○ | ○○ | ○○ | ○○ | ○○ | ○○ | x | x | ○○ | ○○ |
| | Moisture Absorption/Reflow and Cooling/Heating Cycle Reliability Test [500 cycles] | | ○○ | ○○ | ○○ | ○○ | ○○ | ○○ | ○○ | ○○ | x | x | ○○ | ○○ |
| | Moisture Absorption/Reflow and Cooling/Heating Cycle Reliability Test [1000 cycles] | | ○○ | ○○ | ○○ | ○○ | ○○ | ○○ | ○○ | ○○ | x | x | ○○ | ○○ |

TABLE 4

| Compounding Component (part by weight) | | | Example 22 Adhesive AA | Example 23 Adhesive AB | Example 24 Adhesive AC | Example 25 Adhesive AD |
|---|---|---|---|---|---|---|
| Photocurable Compound | Polyfunctional (Meth)acrylate | IRR-214K | | | | |
| | | TMPTA | | | | |
| | | EBECRYL 210 | 8 | 8 | 8 | 10 |
| | Monofunctional (Meth)acrylate | AEH | 12 | 12 | 12 | 13 |
| | | L-A | | | | 12 |
| Photocurable and Thermosetting Compound | | 4HBAGE | 34 | 34 | 34 | |
| | | BLEMMER GH | | | | |
| | | Compound having a thiirane group (B) | | | | |
| Thermosetting Compound | | YD-127 | 20 | | | |
| | | EP-4088S | | | | |
| | | JER630 | | | | |
| | | HP7200L | | | | |
| | | HP-7200HHH | | | | |
| | | N-770 | | 20 | 20 | 30 |
| | | N-670 | | | | |
| | | HP-4770 | | | | |
| | | Compound having a thiirane group (A) | | | | |
| Thermal Curing Agent | | EH-105L | | | | |
| | | EPICURE W | | | | |
| | | DETDA | | | | |
| | | 4,4'-DADPE | | | | |
| | | APB-N | 20 | 20 | | 30 |
| | | 3,3'-DAS | | | | |
| | | CUREHARD-MED | | | 20 | |
| | | 1B2PZ | | | | |
| | | 2E4MZ | | | | |
| Photopolymerization Initiator | | IRGACURE369 | 5 | 5 | 5 | 5 |
| Curing Accelerator | | UCAT SA-102 | 1 | 1 | 1 | 1 |
| Evaluation | Die Shear Strength after B-Staging (N) | | 4.8 | 25.2 | 21.2 | 19.9 |
| | Die Shear Strength after Thermal Curing (N) | | 73 | 94 | 91 | 95 |
| | Die Shear Strength after Moisture-Resistant Adhesion Test (24 hours) | | ○○ | ○○ | ○○ | ○○ |
| | Die Shear Strength after Moisture-Resistant Adhesion Test (48 hours) | | ○ | ○○ | ○○ | ○○ |
| | Check of Voids of Semiconductor Device | | ○○ | ○○ | ○○ | ○ |
| | Moisture Absorption/Reflow and Cooling/Heating Cycle Reliability Test [250 cycles] | | ○○ | ○○ | ○○ | ○○ |
| | Moisture Absorption/Reflow and Cooling/Heating Cycle Reliability Test [500 cycles] | | ○○ | ○○ | ○○ | ○○ |
| | Moisture Absorption/Reflow and Cooling/Heating Cycle Reliability Test [1000 cycles] | | ○○ | ○○ | ○○ | ○○ |

The viscosities at 25° C. and at 10 rpm of the adhesives of Examples measured according to JIS K 2283 using an E-type viscometer ("TVE-22L" manufactured by Toki Sangyo Co., Ltd.) were 5 mPa·s or more and 1600 mPa·s or less.

EXPLANATION OF SYMBOLS

1 . . . Electronic component
1A . . . Primary laminate
2 . . . First electronic component main body
3 . . . Adhesive layer (after heating)
4 . . . Second electronic component main body
11, 11X . . . Inkjet device
12 . . . Adhesive layer
12A . . . Adhesive layer irradiated with light by a first light irradiation part
12B . . . Adhesive layer irradiated with light by a second light irradiation part
13 . . . First light irradiation part
14 . . . Second light irradiation part
21 . . . Ink tank
22 . . . Ejection portion
23, 23X . . . Circulation channel portion
23A . . . Buffer tank
23B . . . Pump
31 . . . Electronic component
32 . . . Multilayered adhesive layer (after heating)
32A, 32B, 32C . . . Adhesive layer (after heating)
51, 71 . . . Semiconductor device
52 . . . Laminate structure
53, 53A . . . Substrate
53a . . . First connection terminal
53b . . . Second connection terminal
54, 61, 72 . . . Adhesive layer
55 . . . Second semiconductor wafer
55a, 73a . . . Connection terminal
56, 63, 74 . . . Wiring
62, 73 . . . First semiconductor wafer
62a . . . Connection terminal

The invention claimed is:
1. An inkjet adhesive comprising:
a photocurable compound,
a photo-radical initiator,
a thermosetting compound having one or more cyclic ether groups or cyclic thioether groups, and
a compound capable of reacting with the thermosetting compound, the compound capable of reacting with the thermosetting compound being a thermal curing agent and containing an aromatic amine which has two or more amino groups, and the inkjet adhesive not comprising a solvent or comprising a solvent at a content of 5 wt % or less.

2. The inkjet adhesive according to claim 1, wherein the aromatic amine is solid at 25° C.

3. The inkjet adhesive according to claim 1, wherein a melting point of the aromatic amine is 50° C. or higher.

4. The inkjet adhesive according to claim 1, wherein the thermosetting compound having one or more cyclic ether groups or cyclic thioether groups is solid at 25° C.

5. The inkjet adhesive according to claim 1, wherein a softening point of the thermosetting compound having one or more cyclic ether groups or cyclic thioether groups is 30° C. or higher.

6. The inkjet adhesive according to claim 5, wherein the thermosetting compound having one or more cyclic ether groups or cyclic thioether groups contains a thermosetting compound having one or more epoxy groups or thiirane groups.

7. The inkjet adhesive according to claim 1, wherein the adhesive includes a photocurable and thermosetting compound having one or more (meth)acryloyl groups and one or more cyclic ether groups or cyclic thioether groups.

8. The inkjet adhesive according to claim 7, wherein the photocurable and thermosetting compound having one or more (meth)acryloyl groups and one or more cyclic ether groups or cyclic thioether groups contains a photocurable and thermosetting compound having one or more (meth)acryloyl groups and one or more epoxy groups or thiirane groups.

9. The inkjet adhesive according to claim 8, wherein the photocurable and thermosetting compound contains 4-hydroxybutyl (meth)acrylate glycidyl ether.

10. The inkjet adhesive according to claim 1, wherein the photocurable compound includes a first photocurable compound having one (meth)acryloyl group, and a second photocurable compound having two or more (meth)acryloyl groups.

11. The inkjet adhesive according to claim 10, wherein in 100 wt % of the total of the first photocurable compound and the second photocurable compound, the content of the first photocurable compound is at least 50 wt % and at most 99.9 wt % and the content of the second photocurable compound is at least 0.1 wt % and at most 50 wt %.

12. The inkjet adhesive according to claim 10, wherein the first photocurable compound contains 2-ethylhexyl (meth)acrylate.

13. The inkjet adhesive according to claim 1, wherein the viscosity at 25° C. and at 10 rpm measured according to HS K 2283 is at least 5 mPa·s and at most 1600 mPa·s.

14. A method for producing a semiconductor device comprising:
    an application step of applying the inkjet adhesive according to claim 1 onto the surface of a support member for mounting a semiconductor element or the surface of a semiconductor element using an inkjet device to form an adhesive layer;
    a step of allowing curing of the adhesive layer to proceed by light irradiation to form a B-staged adhesive layer;
    a step of laminating a semiconductor element on the surface opposite to a side of the support member or the semiconductor element of the B-staged adhesive layer; and
    a step of thermally curing the B-staged adhesive layer after the lamination of the semiconductor element.

15. A method for producing a semiconductor device comprising:
    an application step of ejecting the inkjet adhesive according to claim 1 to the surface of a semiconductor wafer using an inkjet device to form an adhesive layer;
    a step of allowing curing of the adhesive layer to proceed by light irradiation to form a B-staged adhesive layer;
    a step of laminating a cover glass on the surface opposite to a side of the semiconductor wafer of the B-staged adhesive layer to prepare a laminate;
    a step of thermally curing the B-staged adhesive layer in the laminate; and
    a step of cutting the laminate after thermal curing.

16. An electronic component comprising a first electronic component main body, a second electronic component main body, and an adhesive layer making connection between the first electronic component main body and the second electronic component main body,
    wherein the adhesive layer is a cured product of the inkjet adhesive according to claim 1.

17. The electronic component according to claim 16,
    wherein the first electronic component main body is a semiconductor element or a support member for mounting a semiconductor element, and
    the second electronic component main body is a semiconductor element.

* * * * *